US011848045B2

(12) United States Patent
Shang et al.

(10) Patent No.: US 11,848,045 B2
(45) Date of Patent: Dec. 19, 2023

(54) MEMORY INTEGRATED CIRCUIT WITH LOCAL AMPLIFIER MODULE AND LOCAL READ-WRITE CONVERSION MODULE TO IMPROVE OPERATION SPEED AND REDUCE NUMBER OF DATA LINES

(71) Applicant: Changxin Memory Technologies, Inc., Anhui (CN)

(72) Inventors: Weibing Shang, Hefei (CN); Jixing Chen, Hefei (CN); Xianjun Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 210 days.

(21) Appl. No.: 17/396,688

(22) Filed: Aug. 7, 2021

(65) Prior Publication Data

US 2021/0398586 A1  Dec. 23, 2021

Related U.S. Application Data

(63) Continuation of application No. PCT/CN2021/078505, filed on Mar. 1, 2021.

(30) Foreign Application Priority Data

Jun. 19, 2020  (CN) .......................... 202010568039.9

(51) Int. Cl.
*G11C 7/12* (2006.01)
*G11C 11/4091* (2006.01)
(Continued)

(52) U.S. Cl.
CPC ........ *G11C 11/4091* (2013.01); *G11C 7/1048* (2013.01); *G11C 7/1078* (2013.01);
(Continued)

(58) Field of Classification Search
CPC ............ G11C 11/4091; G11C 11/4094; G11C 11/4096; G11C 7/1048; G11C 7/1051;
(Continued)

(56) References Cited

U.S. PATENT DOCUMENTS 5,381,374 A  1/1995 Shiraishi et al.
6,208,575 B1  3/2001 Proebsting
(Continued)

FOREIGN PATENT DOCUMENTS

CN    1637947 A   7/2005
CN  101952957 A   1/2011
(Continued)

OTHER PUBLICATIONS

PCT International Search Report and the Written Opinion dated Jun. 4, 2021, issued in related International Application No. PCT/CN2021/078505, with English translation (14 pages).
(Continued)

*Primary Examiner* — Mushfique Siddique
(74) *Attorney, Agent, or Firm* — Sheppard Mullin Richter & Hampton LLP

(57) ABSTRACT

Embodiments of the present invention provide a semiconductor integrated circuit of a memory. The semiconductor integrated circuit can comprise a column selection module, a local read-write conversion module, and an amplifier module. The column selection module can be configured to couple a first data line to a bit line and couple a complementary data line to a complementary bit line. The local read-write conversion module can be configured to perform data transmission from at least one of the first data line or the first complementary data line to a second data line. The data transmission can occur during a memory read-write operation and in response to the local read-write conversion module receiving a read write control signal. The amplifier
(Continued)

module can be configured to amplify data of the second data line based on a reference signal of a reference data line. The reference signal can serve as a reference for amplifying the data of the second data line.

19 Claims, 7 Drawing Sheets

(51) Int. Cl.
*G11C 11/4096* (2006.01)
*G11C 11/4094* (2006.01)
*G11C 7/10* (2006.01)
*G11C 11/4093* (2006.01)
*G11C 11/4097* (2006.01)

(52) U.S. Cl.
CPC ...... *G11C 11/4093* (2013.01); *G11C 11/4094* (2013.01); *G11C 11/4096* (2013.01); *G11C 11/4097* (2013.01); *G11C 2207/002* (2013.01); *G11C 2207/005* (2013.01)

(58) Field of Classification Search
CPC ............ G11C 11/4093; G11C 11/4097; G11C 2207/002; G11C 2207/005
See application file for complete search history.

(56) References Cited

U.S. PATENT DOCUMENTS

| | | | | |
|---|---|---|---|---|
| 2007/0070749 A1* | 3/2007 | Lee | ...................... | G11C 11/4097 365/203 |
| 2008/0094922 A1* | 4/2008 | Hanzawa | ................. | G11C 7/12 365/208 |
| 2010/0226192 A1* | 9/2010 | Moon | ................. | G11C 11/4096 365/203 |
| 2010/0238697 A1 | 9/2010 | Juengling | | |
| 2011/0103123 A1* | 5/2011 | Nakaoka | ............. | G11C 11/4074 365/63 |
| 2012/0092940 A1* | 4/2012 | Chang | ...................... | G11C 7/06 365/189.15 |
| 2012/0243342 A1* | 9/2012 | Lee | ..................... | G11C 16/0483 365/207 |
| 2012/0287740 A1* | 11/2012 | Vimercati | ................ | G11C 7/12 327/52 |
| 2013/0010523 A1 | 1/2013 | Yan et al. | | |
| 2014/0063979 A1* | 3/2014 | Lee | ...................... | G11C 7/1006 365/207 |
| 2014/0254260 A1 | 9/2014 | Hung et al. | | |
| 2014/0286075 A1 | 9/2014 | Katayama et al. | | |
| 2015/0078058 A1 | 3/2015 | Yabuuchi | | |
| 2017/0316833 A1 | 11/2017 | Ihm et al. | | |
| 2019/0139594 A1* | 5/2019 | Ryu | ..................... | G11C 7/1048 |

FOREIGN PATENT DOCUMENTS

| | | |
|---|---|---|
| CN | 102405499 A | 4/2012 |
| CN | 104051008 A | 9/2014 |
| CN | 212392000 U | 1/2021 |

OTHER PUBLICATIONS

PCT International Preliminary Report on Patentability dated Dec. 29, 2022, issued in related International Application No. PCT/CN2021/078505, with English translation (11 pages).
Extended European Search Report dated Sep. 16, 2022, issued in related European Patent Application No. 21819709.3 (13 pages).
Examination Report dated Apr. 18, 2023, issued in related European Patent Application No. 21819709.3 (11 pages).

* cited by examiner

US 11,848,045 B2

MEMORY INTEGRATED CIRCUIT WITH LOCAL AMPLIFIER MODULE AND LOCAL READ-WRITE CONVERSION MODULE TO IMPROVE OPERATION SPEED AND REDUCE NUMBER OF DATA LINES

CROSS-REFERENCE To RELATED APPLICATIONS

This application is a continuation application of International Patent Application No.: PCT/CN2021/078505, filed on Mar. 1, 2021, which claims priority to Chinese Patent Application No.: 202010568039.9, filed on Jun. 19, 2020. The above-referenced applications are incorporated herein by reference in their entirety.

TECHNICAL FIELD

The present invention relates to the field of semiconductor technologies. In particular, the present invention relates to a semiconductor integrated circuit of a semiconductor memory.

BACKGROUND

A dynamic random access memory (DRAM) is a semiconductor storage device commonly used in computing systems. The DRAM can include a plurality of repeating memory cells. Each memory cell can include a capacitor and a transistor. A gate of the transistor can be connected or coupled to a word line of the DRAM, a drain of the transistor can be connected or coupled to a bit line of the DRAM, and a source of the transistor can be connected or coupled to the capacitor. A voltage signal on the word line can turn ON or OFF the transistor. For example, a high voltage signal (e.g., a digital value of 1) can turn ON the transistor and a low voltage signal (e.g., a digital value of 0) can turn OFF the transistor. In some cases, a high voltage signal (e.g., a digital value of 1) can turn OFF the transistor and a low voltage signal (e.g., a digital value of 0) can turn ON the transistor. In this way, data (i.e., voltage) stored in the capacitor can be read through the bit line. Alternatively, in some cases, data (i.e., voltage) on the bit line can be written into the capacitor for storage.

In some cases, a DRAM may be classified into various categories based on applications for which the DRAM is used. For example, a DRAM used in general computing systems can be categorized as a double data rate (DDR) DRAM, a DRAM used in graphical systems can be categorized as a graphics double data rate (GDDR) DRAM, and a DRAM used in low-power computing systems can be categorized as a low power double data rate (LPDDR) DRAM. As DRAMs are deployed to more technology fields, such as the mobile computing field, users may have higher requirements for DRAM data read and data write speeds. However, current data read and data write speeds of DRAMs need to be further improved to be used in a wide array of computing systems.

SUMMARY

Embodiments of the present invention provide a semiconductor integrated circuit and a memory, to reduce the number of data lines. The semiconductor integrated circuit can include a first data line coupled to a bit line through a column selection module and a first complementary data line connected to a complementary bit line through the column selection module, a second data line, and a reference data line. The reference data line can be configured to provide a reference signal. The semiconductor integrated circuit can further include a local read-write conversion module configured to perform, in response to a read-write control signal, data transmission between the first data line and the second data line and data transmission between the first complementary data line and the second data line during a read-write operation. The semiconductor integrated circuit can further include an amplifier module configured to receive data of the second data line and the reference signal and amplify the data of the second data line. The reference signal can serve as a reference for amplifying the data of the second data line.

In some embodiments, the reference data line can have fixed voltage potential.

In some embodiments, the semiconductor integrated circuit can further include a reference module configured to output the reference signal to the reference data line in response to a read control signal of the read-write control signal. The reference module has a discharge capability that can cause voltage potential of the reference signal to decreases during a read operation.

In some embodiments, during the read operation, the local read-write conversion module can have a first discharge speed to reduced voltage potential of the second data line from a first voltage to a second voltage. The reference module has a second discharge speed during the read operation. The second discharge speed can be less than the first discharge speed.

In some embodiments, the semiconductor integrated circuit can further include a reference control line configured to provide a reference control signal. The reference module can be coupled to the reference control line. The reference module can output the reference signal to the reference data line in response to the read control signal and the reference control signal.

In some embodiments, the reference module can have a first port, a second port, a third port, and a fourth port. The first port can receive the read control signal, the second port can be coupled to the reference data line, the third port can be ground, and the fourth port can receive the reference control signal. The reference module can perform discharging between the second port and the third port in response to the read control signal and the reference control signal to reduce voltage potential of the reference data line.

In some embodiments, the reference module can include a first switch unit and a second switch unit. The first switch unit can be coupled to the first port and the third port. The first switch unit can have a first node. The first switch unit can become conductive in response to the read control signal coupled to the first node and the third port. The second switch unit can be coupled to the second port and the fourth port. The second switch unit can have a second node. The second node can be coupled to the first node. The second switch unit can become conductive in response to the reference control signal coupled to the second port and the second node.

In some embodiments, the local read-write conversion module can include a local read unit. The local read unit can be configured to transmit data of the first data line or the first complementary data line to the second data line during the read operation in response to the read control signal of the read-write control signal. The local read unit can include at least two local transistors. The reference module can includes at least one reference transistor and a conductivity of the at least one reference transistor is weaker than a conductivity of the at least two local transistors.

In some embodiments, a channel width of the at least one reference transistor is less than a channel width of the at least two local transistors.

In some embodiments, the at least two local transistors can include a local read control transistor and a local read transmission transistor. The local read control transistor can be configured to be conducted in response to the read control signal. One port of the local read control transistor can be grounded. The local read transmission transistor can be configured to be conductive in response to the data signal of the first complementary data line to cause the second data line to be grounded through the local read transmission transistor and the local read control transistor. In some embodiments, the at least one reference transistor can include a reference control transistor configured to be conductive in response to the read control signal to cause the reference data line to be grounded through the reference control transistor. A channel width of the reference control transistor can be less than a channel width of the local read control transistor.

In some embodiments, the at least one reference transistor can further include a reference transmission transistor configured to be conductive in response to the reference control signal to cause the reference data line to be grounded through the reference control transistor and the reference transmission transistor. A channel width of the reference transmission transistor can be less than a channel width of the local read transmission transistor.

In some embodiments, the channel width of the reference control transistor can be less than or equal to ⅔ of the channel width of the local read control transistor. The channel width of the reference transmission transistor can be less than or equal to ⅔ of the channel width of the local read transmission transistor.

In some embodiments, the channel width of the reference control transistor can be ½ of the channel width of the local read control transistor. The channel width of the reference transmission transistor can be ½ of the channel width of the local read transmission transistor.

In some embodiments, the amplifier module can be a differential amplifier. In such embodiments, a first input end of the differential amplifier can be connected or coupled to the second data line and a second input end of the differential amplifier can be connected or coupled to the reference data line.

In some embodiments, the local amplifier module can be disposed between the first data line and the first complementary data line. In such embodiments, the local amplifier can be configured to amplify data of the first data line and data of the first complementary data line.

In some embodiments, the local amplifier module can include a first phase inverter and a second phase inverter. An input end of the first phase inverter can be coupled to the first data line and an output end of the first phase inverter can be coupled to the first complementary data line. An input end of the second phase inverter can be coupled to the output end of the first phase inverter and the first complementary data line and an output end of the second phase inverter can be coupled to the input end of the first phase inverter and the first data line.

An embodiment of the present invention further provides a memory comprising memory cell arrays and sense amplifier arrays that are alternately arranged. Each of the memory cell arrays can be connected or coupled to at least one of the sense amplifier arrays to form a memory array. The foregoing semiconductor integrated circuit, wherein each first data line and first complementary data line are connected or coupled to a corresponding memory cell array through the sense amplifier array, to perform a read-write operation on the memory cell array through the local read-write conversion module.

In some embodiments, the sense amplifier array includes: a plurality of first groups of sense amplifier arrays located in odd columns and a plurality of second groups of sense amplifier arrays located in even columns; the second data line includes: a first group of data lines corresponding to the first group of sense amplifier arrays and a second group of data lines corresponding to the second group of sense amplifier arrays, where the first group of data lines correspond to the first data line and the first complementary data line that are connected to the first group of sense amplifier arrays, and the second group of data lines correspond to the first data line and the first complementary data line that are connected to the second group of sense amplifier arrays; the reference data line includes: a first reference data line configured to provide a first reference signal and a second reference data line configured to provide a second reference signal; and the amplifier module includes: a first group of amplifier modules, configured to receive the first reference signal and data signals of the first group of data lines and amplify the data signals of the first group of data lines; and a second group of amplifier modules, configured to receive the second reference signal and data signals of the second group of data lines and amplify the data signals of the second group of data lines.

In some embodiments, the first group of amplifier modules correspond to the sense amplifier arrays in the odd columns, and the second group of amplifier modules correspond to the sense amplifier arrays in the even columns; and the first group of amplifier modules share the same first reference data line, and the second group of amplifier modules share the same second reference data line.

In some embodiments, one half of a plurality of second data lines are located on one side of the first reference data line and the second reference data line, and the other half of the plurality of second data lines are located on the other side of the first reference data line and the second reference data line.

The embodiments of the present invention provide a semiconductor integrated circuit, including: a first data line connected to a bit line through a column selection module and a first complementary data line connected to a complementary bit line through the column selection module, a second data line, and a reference data line; and a local read-write conversion module, configured to perform, in response to a read-write control signal, data transmission between the first data line and the second data line and data transmission between the first complementary data line and the second data line during a read-write operation. Because a second complementary data line whose phase is opposite to that of the second data line is not disposed during a read operation, a number of data lines used in the semiconductor integrated circuit is reduced, so that power consumption and a heat dissipation need are reduced, thereby improving electrical performance of the semiconductor integrated circuit.

In some embodiments, during the read operation, the local read-write conversion module has a first discharge speed. A reference module is configured to output a reference signal to the reference data line in response to a read control signal, where the reference signal serves as a reference for a data signal of the second data line, and during the read operation, the reference module has a discharge characteristic, the reference module has a second discharge speed, and the second discharge speed is less than the first discharge speed. Because the reference module has a discharge characteristic, during the read operation, when the second data line is read as 1, a potential difference between the data signal of the second data line and the reference data signal gradually increases, so that a sense margin for reading 1 by the semiconductor integrated circuit gradually increases. When the second data line is read as 0, potential of both the data signal of the second data line and the reference data signal gradually decrease, and because the second discharge speed is less than the first discharge speed, the potential of the data signal of the second data line decreases faster than the potential of the reference data signal, so that a potential difference between the data signal of the second data line and the reference data signal gradually increases, and therefore, a sense margin for reading 0 by the semiconductor integrated circuit gradually increases. Therefore, in the embodiments of the present invention, the sense margin for reading 0 and the sense margin for reading 1 may be basically consistent. In addition, both the sense margin for reading 0 and the sense margin for reading 1 can increase over time, which avoids a case that the sense margin for reading 1 does not change while the sense margin for reading 0 increases, so that read performance is improved.

In some embodiments, the semiconductor integrated circuit further includes the reference data line for providing a reference control signal, and a number of read control signals and reference control signals that the reference module respond is the same as a number of control signals of a local read unit in the local read-write conversion module, so that a difference between the first discharge speed and the second discharge speed can be controlled by designing a transistor performance difference, thereby further improving read performance.

BRIEF DESCRIPTION OF THE DRAWINGS

One or more embodiments are exemplified by the pictures in the accompanying drawings corresponding to the embodiments. These exemplary descriptions do not constitute a limitation on the embodiments. Elements having the same reference numerals in the accompanying drawings are denoted as similar elements. Unless specifically stated, the figures in the accompanying drawings do not constitute a limitation of scale.

DETAILED DESCRIPTION OF THE EMBODIMENTS

Figure 1:
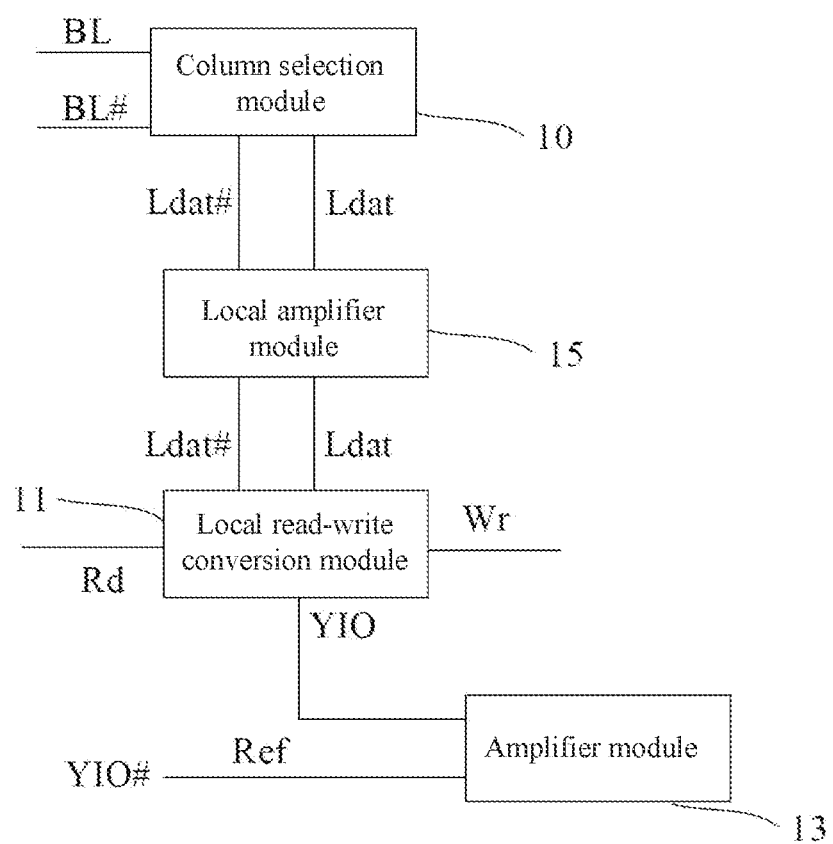
FIG. 1 is a schematic diagram of a semiconductor integrated circuit of a memory according to a first embodiment of the present invention.

As discussed above, current data read and data write speeds of DRAMs are inadequate as DRAMs are in a variety of computing systems. During a data read operation of a DRAM, upon a selection (e.g., an activation) of a word line from which data (e.g., voltage) stored in memory cells of the word line is to be read, the data is transmitted from the memory cells to respective bit lines of the memory cells. This transmission of the data from the memory cells to the bit lines can cause voltages (e.g., precharge voltages) associated with the bit lines to slightly increase or decrease depending on the data. Under conventional approaches, sense amplifiers connected or coupled to the bit lines can be configured to pull voltages of the bit lines up or down to match the data stored in the memory cells. In this way, the bit lines are immune to voltage fluctuations as the data is read from the memory cells. A column selection module can be configured to transmit a voltage (e.g., a binary value of 0 or 1) of a bit line to a local data line based on a column selection signal. The column selection module can further transmit voltage of the local data line to a global data line through a semiconductor integrated circuit.

Under conventional techniques, a common signaling technique for performing data read and data write operations of a DRAM is by using a dual-ended transmission or dual-phase transmission technique. In such a signaling technique, a local data line and a global data line of the DRAM each can comprise a pair of complementary data lines. For example, the local data line can include a first local data line and a second local data line that are complementary to each other. In this example, when the first local data is at a high voltage (e.g., a binary value of 1), the second local data line is at a low level (e.g., a binary value of 0). Similarly, the global data line can include a first global data line and a second global data line that are complementary to each other. When the first global data is at a high voltage (e.g., a binary value of 1), the second global data line is at a low level (e.g., a binary value of 0). However, for DRAMs operating in a dual-ended or dual-phase transmission manner, power consumptions of the DRAMs can be high because data lines are in pairs. Furthermore, because a number of data lines is large (twice as many data lines), power dissipation through the data lines can be high. Moreover, the large number of data lines can add complexity to routing and, in some cases, may affect performance of the DRAMs.

The disclosure provided herein solves the problems described above. In various embodiments, a semiconductor integrated circuit of a memory can be provided. Data of data lines associated with the semiconductor integrated circuit can be transmitted through a single-phase transmission manner such that the data lines do not comprise a pair of complementary data lines. In this way, a number of data lines in the memory can be reduced. For example, a semiconductor integrated circuit of a memory operating under a dual-ended transmission manner can comprise 136 complementary data lines (e.g., 136×2=272). By leveraging the invention disclosed herein, a number of data lines can be reduced from 272 to 136 (e.g., half of 272). In this way, various problems associated with a semiconductor integrated circuit with a large number of data lines, such as high power consumption, large parasitics, heat dissipation, complex trace routing, etc. can be reduced, thereby improving electrical performance of the semiconductor integrated circuit. The claimed invention is described in greater detail herein.

To make objectives, technical solutions, and advantages of the present invention clearer, the following disclosure describes various embodiments of the present invention in detail with reference to drawings. However, a person of ordinary skill in the art may understand that in the embodiments of the present invention, technical solutions are proposed for readers to better understand the present invention. The technical solutions described in the present invention can be implemented even without these technical details, changes, and modifications made based on the following embodiments.

FIG. 1 is a schematic diagram of a semiconductor integrated circuit of a memory according to a first embodiment of the present invention. Referring to FIG. 1, in some embodiments, the semiconductor integrated circuit can include a bit line BL and a complementary bit line BL# that are connected or coupled to a first data line Ldat and a first complementary data line Ldat#, respectively, through a column selection module 10. The semiconductor integrated circuit can further include a second data line YIO and a reference data line YIO#. The reference data line YIO# can be configured to provide a reference signal to operate the semiconductor integrated circuit. As shown in FIG. 1, in some embodiments, the semiconductor integrated circuit can further include a local read-write conversion module 11 and an amplifier module 13. The local read-write conversion module 11 can be configured to transmit data from either the first data line Ldat or the first complementary data line Ldat# to the second data line YIO during a read-write operation of the memory. The local read-write conversion module 11 can transmit the data in response to receiving a read-write control signal. The amplifier module 13 can be configured to receive data of the second data line YIO and amplify the data based on the reference signal. In such configurations, the reference signal can serve as a reference for amplifying the data of the second data line YIO.

In some embodiments, the first data line Ldat and the first complementary data line Ldat# can be complementary data lines. For example, when the first data line is at a high voltage (e.g., a binary value of 1), the first complementary data line is a low voltage (e.g., a binary value of 0). Likewise, as another example, when the first data line is at a low voltage (e.g., a binary value of 0), the first complementary data line is a high voltage (e.g., a binary value of 1). During a read-write operation, data of at least one of the first data line Ldat or the first complementary data line Ldat# is at a high voltage and data of the other data line is at a low voltage.

In some embodiments, the first data line Ldat can be a local data line, the first complementary data line Ldat# can be a complementary local data line, and the second data line YIO can be a global data line. In some embodiments, the semiconductor integrated circuit can be integrated into a memory (e.g., a DRAM). In such embodiments, when performing a data read operation or a data write operation on the memory, the column selection module 10 can select, based on various signals, memory cells of the memory with which to read data or write data. Data to be written into the memory cells can be represented as a voltage (e.g., binary values of 0 or 1) on the first data line and the first complementary data line. Similarly, data to be read from the memory cells can be represented as a voltage (e.g., binary values of 0 or 1) on the first data line and the first complementary data line. Voltage of the first data line and the first complementary data line can be transmitted to the second data line YIO and amplified to prior to reading or writing the data into the memory cells.

In some embodiments, the read-write control signal can include a read control signal Rd and a write control signal Wr. Based on the read-write control signal, the local read-write conversion module 11 can be configured to transmit data between either the first data line Ldat and the first complementary data line Ldat# to the second data line YIO. For example, during a data read operation, the local read-write conversion module 11 can transmit data (e.g., a voltage) of the first data line Ldat and the first complementary data line Ldat# to the second data line YIO in response to the read control signal Rd being at a particular voltage (e.g., a binary value of 0 or 1). As another example, the local read-write conversion module 11 can transmit (e.g., a voltage) data of the second data line YIO to the first data line Ldat and the first complementary data line Ldat# in response to the write control signal Wr being at a particular voltage (e.g., a binary value of 0 or 1).

Figure 2:
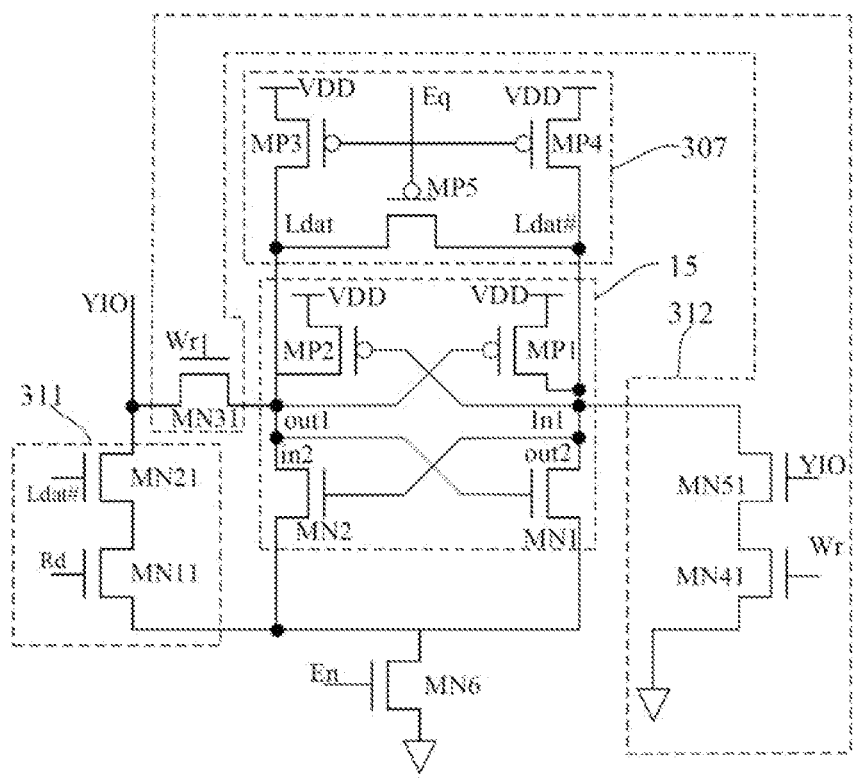
FIG. 2 is an electrical circuit diagram of the semiconductor integrated circuit of the memory according to the first embodiment of the present invention.

FIG. 2 is an electrical circuit diagram of the semiconductor integrated circuit of the memory according to the first embodiment of the present invention. Referring to FIG. 2, in some embodiments, the local read-write conversion module 11 of the semiconductor integrated circuit can include a local read unit 311 and a local write unit 312. The local read unit 311 can be configured to transmit data of the first data line Ldat or the first complementary data signal Ldat# to the second data line YIO during a data read operation. The local read unit 311 can transmit the data in response to receiving the read control signal Rd. The local write unit 312 can be configured to transmit data of the second data line YIO to the first data line Ldat or the first complementary data line Ldat# during a data write operation. The local write unit 312 can transmit the data in response to receiving the write control signal Wr.

As shown in FIG. 2, in some embodiments, the local read unit 311 can include a local read control transistor MN11 and a local read transmission transistor MN21. The local read control transistor MN11 can be configured to turn ON (i.e., conduct) in response to the read control signal Rd being at a particular voltage. The local read transmission transistor MN21 can be configured to turn ON (i.e., conduct) in response to the first complementary data line Ldat# being at a particular voltage. In some embodiments, when both the local read transmission transistor MN21 and local read control transistor MN11 are turned ON, a voltage on the second data line YIO can be grounded through an enable transistor MN6 connected or coupled to a ground. As shown in FIG. 2, in some embodiments, a first terminal (e.g., a source) of the enable transistor MN6 can be connected or coupled to the ground and a second terminal (e.g., a drain) of the enable transistor MN6 can be connected or coupled to a first terminal (e.g., a source) of the local read control transistor MN11. A second terminal (e.g., a drain) of the local read control transistor MN11 can be connected or coupled to a first terminal (e.g., a source) of the local read transmission transistor MN21. A second terminal (e.g., a drain) of the local read transmission transistor MN21 can be connected or coupled to the second data line YIO.

In some embodiments, the local write unit 312 can include a first local write control transistor MN31, a second local write control transistor MN41, and a local write transmission transistor MN51. A gate of the first local write control transistor MN31 can be connected or coupled to the write control signal Wr, a first terminal of the first local write control transistor MN31 can be connected or coupled to the second data line YIO, and a second terminal of the first local write control transistor MN31 can be connected or coupled to the first data line Ldat. A gate of the second local write control transistor MN41 can be connected or coupled to the write control signal Wr, a first terminal of the second local write control transistor MN41 can be connected or coupled to the ground and a second terminal of the second local write control transistor MN41 can be connected or coupled to a first terminal of the local write transmission transistor MN51. A gate of the local write transmission transistor MN51 can be connected or coupled to the second data line YIO, and a second terminal of the local write transmission transistor MN51 can be connected or coupled to the first complementary data line Ldat#. In some embodiments, the first local write control transistor MN31 can connect or couple the second data line YIO to the first data line Ldat in response to the write control signal Wr being at a particular voltage (e.g., a binary value of 0 or 1).

Referring to FIG. 2, in some embodiments, the memory can further include a local amplifier 15. The local amplifier module 15 can connect or couple the first data line Ldat to the first complementary data line Ldat#. The local amplifier module 15 can be configured to amplify data of the first data line Ldat and data of the first complementary data line Ldat#. In some embodiments, the local amplifier module 15 can be a differential circuit (e.g., a differential amplifier) that amplifies the data of the first data line Ldat and the data of the first complementary data line Ldat#. In this way, the first data line Ldat and the first complementary data line Ldat# can be distinguished from one another more quickly, thereby improving a data transmission speed and data read-write speeds. In addition, because the data of the first data line Ldat and the first complementary data line Ldat# are amplified, the need for the first data line Ldat and the first complementary data line Ldat# to be driven by a sense amplifier circuit of the memory can be reduced. Therefore, even if an area on the memory corresponding to the sense amplifier circuit decreases, the sense amplifier circuit still has sufficient drive capability to drive the first data line Ldat and the first complementary data line Ldat#. As such, the semiconductor integrated circuit can have better electrical performance while meeting the development trend of component miniaturization, thereby improving storage performance of the memory including the semiconductor integrated circuit.

In some embodiments, the local amplifier module 15 can include a first phase inverter and a second phase inverter. An input end of the first phase inverter can be electrically connected or coupled to the first data line Ldat and an output end of the first phase inverter can be electrically connected or coupled to the first complementary data line Ldat#. An input end of the second phase inverter can be electrically connected or coupled to the output end of the first phase inverter and the first complementary data line Ldat#, and an output end of the second phase inverter can be electrically connected or coupled to the input end of the first phase inverter and the first data line Ldat.

In some embodiments, the first phase inverter can include a first PMOS transistor MP1 and a first NMOS transistor MN1. A gate of the first PMOS transistor MP1 and a gate of the first NMOS transistor MN1 can be connected or coupled to a second input end in2 of the local amplifier module 15. A first terminal (e.g., a source) of the first PMOS transistor MP1 can be connected to a supply voltage VDD and a second terminal (e.g., a drain) of the first PMOS transistor MP1 and a first terminal (e.g., a drain) of the first NMOS transistor MN1 are can be coupled as an output end out2 of the first phase inverter.

In some embodiments, the second phase inverter includes a second PMOS transistor MP2 and a second NMOS transistor MN2. A gate of the second PMOS transistor MP2 and A gate of the second NMOS transistor MN2 can be connected or coupled to a first input end in1 of the second phase inverter. A first terminal (e.g., a source) of the second PMOS transistor MP2 can be connected or coupled to the supply voltage VDD and a second terminal (e.g., a drain) of the second PMOS transistor MP2 and a first terminal (e.g., a drain) of the second NMOS transistor MN2 can be connected or coupled to an output end out1 of the second phase inverter.

During a data read operation, because the local amplifier module 15, data transmission speed of data from the bit line BL to the first data line Ldat can be improved. Similarly, data transmission speed of data from the complementary bit line BL# to the first complementary data line Ldat# can also be improved. In this way, the need of using a sense amplifier to drive data of the memory can be reduced. For example, data of the bit line BL is at a high voltage and data of the complementary bit line BL# is at a low voltage. Because the first input end in1 of the first phase inverter is connected or coupled to the second output end out2 of the second phase inverter, and the first output end out1 of the first phase inverter is connected or coupled to the second input end in2 of the second phase inverter, when the data of the bit line BL and the data of the complementary bit line BL# are transmitted to the first data line Ldat and the first complementary bit line Ldat#, respectively, a pull-up speed of the first data line Ldat and a pull-down speed of the first complementary data line Ldat# are increased, thereby reducing the need of using the sense amplifier to drive the first data line Ldat and the first complementary data line Ldat#.

Further, during a data read operation, the first data line Ldat is complementary to the first complementary data line Ldat#, in other words, when one of the first data line Ldat or the first complementary data line Ldat# is at a high voltage, the other data line is at a low voltage. Because of the local amplifier module 15, data of the first data line Ldat and data of the first complementary data line Ldat# are amplified. In this way, the difference between the first data line Ldat and the first complementary data line Ldat# can be increased more quickly and a transmission speed of data from the first data line Ldat and the first complementary data line Ldat# to the second data line YIO can be improved. For example, when the first data line Ldat is at a high voltage (e.g., a binary value of 1), the first complementary data line Ldat# is at a low voltage (e.g., a binary value of 0). In this example, data (e.g., voltage) of the first data line Ldat and data (e.g., voltage) of the first complementary data line Ldat# are transmitted to the second data line YIO. Because of the local amplifier module 15, the voltage of the first complementary data line Ldat# can approach to 0 V quicker. In this way, the first data line Ldat and the first complementary data line Ldat# can be distinguished between each other quicker, and the speeds of the first data line Ldat and the first complementary data line Ldat# are improved to reach a large-signal mode. In this way, during a data read operation, data can be transmitted from the first data line Ldat and the first complementary data line Ldat# to the second data line YIO at higher speeds.

In some embodiments, the semiconductor integrated circuit further includes the enable NMOS transistor MN6. A gate of the enable NMOS transistor MN6 can be connected or coupled to an enable signal En. A source of the enable NMOS transistor MN6 can be connected or coupled to the ground. In some embodiments, the first phase inverter and the second phase inverter can also be connected or coupled to a drain of the enable NMOS transistor MN6. Specifically, a source of the first NMOS transistor MN1 and a source of the second NMOS transistor MN2 are connected to the drain of the enable NMOS transistor MN6.

In some embodiments, the semiconductor integrated circuit may further include a precharging module 307. The precharging module 307 can be connected or coupled between the first data line Ldat and the first complementary data line Ldat#. The precharging module 307 can be configured to precharge the first data line Ldat and the first complementary data line Ldat# line in response to a precharging control signal Eq.

In some embodiments, the precharging module 307 can include a third PMOS transistor MP3, a fourth PMOS transistor MP4, and a fifth PMOS transistor MP5. A gate of the third PMOS transistor MP3, a gate of the fourth PMOS transistor MP4, and a gate of the fifth PMOS transistor MP5 can be connected or coupled to the precharge control signal Eq. A source of the third PMOS transistor MP3 and a source of the fourth PMOS transistor MP4 can be connected to the supply voltage VDD. A drain of the third PMOS transistor MP3 can be connected or coupled to the first data line Ldat. A drain of the fourth PMOS transistor MP4 can be connected or coupled to the first complementary data line Ldat#. The fifth PMOS transistor MP5 can be connected or coupled the first data line Ldat to the first complementary data line Ldat# in response to the precharge control signal Eq.

Figure 3:
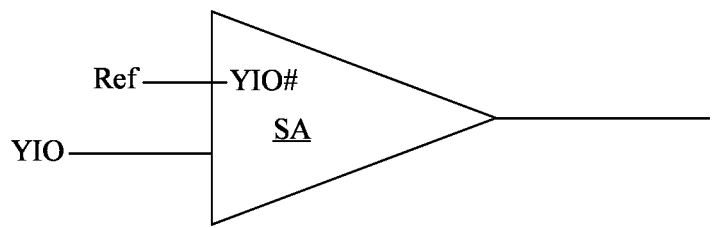
FIG. 3 is a schematic diagram of the amplifier module 13 according to an embodiment of the present invention.

FIG. 3 is a schematic diagram of the amplifier module 13 according to an embodiment of the present invention. Referring to FIG. 3, in some embodiments, the amplifier module 13 can be a single-ended amplifier SA. A first input of the single-ended amplifier SA can be connected or coupled to the reference data line YIO# having a fixed potential (e.g., a voltage potential). The reference data line YIO# can serve as a reference for determining whether the second data line YIO has a binary value of 0 or 1. In some embodiments, the reference data line YIO# can be used for sense 1 or sense 0. In some embodiments, the reference data line YIO# can be a component of the single-ended amplifier SA.

Referring back to FIG. 2, during a data read operation, the read control signal Rd is set to a high voltage (e.g., a binary value of 1). This causes the local read control transistor MN11 to turn ON. When the first complementary data line Ldat# is at a low voltage (e.g., a binary value of 0), the corresponding first data line is at a high voltage (e.g., a binary value of 1). Because the potential of the second data line YIO has been previously precharged to a high voltage, and the local read transmission transistor MN21 is not conducting and the second data line YIO remains at the high voltage (e.g., a binary value of 1).

Referring back to FIG. 2, during a data read operation, the read control signal Rd is set to a high voltage. This causes the local read control transistor MN11 to turn ON. When the first complementary data line Ldat# is also at a high voltage (e.g., a binary value of 1), the local read transmission transistor MN21 is turned ON. As such, a voltage potential of the second data line YIO is pulled down to 0 V through the enable transistor MN6. After receiving data (e.g., voltage) of the second data line YIO, the amplifier module 13 can amplify the data of the second data line YIO based on the reference signal and outputs an amplified data signal. In other words, the data of the second data line YIO outputted by the amplifier module 13 is 0 V. Specifically, in the process of pulling down the voltage potential of the second data line YIO, the voltage potential of the second data line YIO is at a voltage lower than a voltage of the reference signal. As a result, the amplifier module 13 amplifies the data of the second data line YIO, in other words, the second data line YIO is pulled down to 0 V. In some embodiments, the voltage of the reference signal can be determined based on parameters associated with the amplifier module 13.

Figure 4:
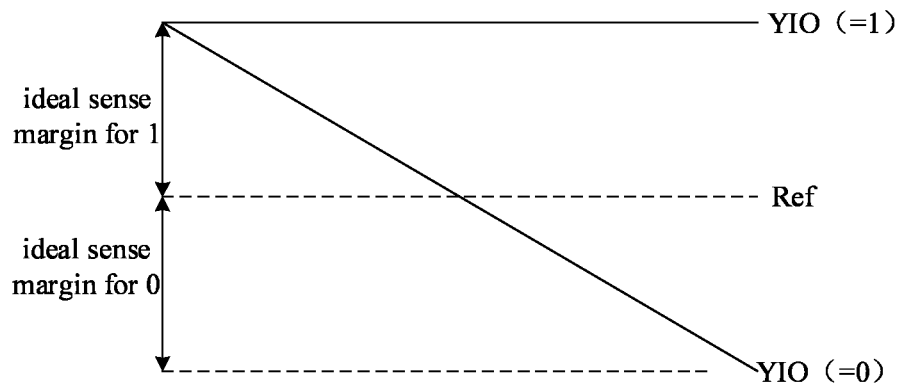
FIG. 4 is a diagram of a voltage potential change of data of the second data line YIO during a data read operation according to an embodiment of the present invention.

FIG. 4 is a diagram of a voltage potential change of data of the second data line YIO during a data read operation according to an embodiment of the present invention. As shown in FIG. 4, in some embodiments, data of the second data line YIO equaling a binary value of 0 (e.g., YIO(=0)) can indicate that a voltage potential of the second data line changing over time when the second data line changes to 0. Data of the second data line YIO equaling a binary value of 1 (e.g., YIO(=1)) can indicate that a voltage potential of the second data line changes over time when the second data line changes to 1 or remains at 1. Ref indicates a reference signal, ideal sense margin for 1 is an ideal sense margin for sense 1, ideal sense margin for 0 is an ideal sense margin for sense 0, the sense margin for sense 1 is an absolute value of a potential difference between YIO (=1) and Ref, and the sense margin for sense 0 is an absolute value of a potential difference between YIO (=0) and Ref.

Referring to FIG. 4, when data of the second data line YIO changes to 1 or remains at 1, a voltage potential of the reference signal Ref is lower than a voltage potential of the second data line YIO. Therefore, the data of the second data line amplified by a single-ended amplifier (e.g., the single-ended amplifier of FIG. 3) is 1 (e.g., a high voltage). When data of the second data line YIO changes to 0 or remains at 0, a voltage potential of the second data line YIO gradually decreases until the voltage potential of the second data line YIO becomes lower than the voltage potential of the reference signal Ref, at which point, the data of the second data line YIO amplified by the single-ended amplifier is 0 (e.g., a low voltage).

In the technical solution of the semiconductor integrated circuit provided herein, because data of the second data line YIO is transmitted in a single-phase transmission manner, the second data line YIO is no longer in pairs. A second complementary data line whose phase is opposite to that of the second data line YIO, therefore, does not need to be disposed during a data read operation. Therefore, a number of data lines needed by the semiconductor integrated circuit can be significantly reduced. Correspondingly, power consumption of the semiconductor integrated circuit, heat generated by the data line, and the data line cabling difficulty can also be reduced. In addition, because the amplifier module is a single-ended amplifier, the circuitry of the semiconductor integrated circuit can be simplified while maintaining the ability to amplify data of the second data line YIO.

A second embodiment of the present invention further provides a semiconductor integrated circuit. This embodiment is basically the same as the semiconductor integrated circuit provided in the foregoing embodiment. The difference lies in that a reference signal provided by a reference data line serves as a reference for a second data line, and the reference signal is changing. Therefore, sense margins for sense 0 and sense 1 change over time, so that a read performance of the semiconductor integrated circuit during a data read operation is improved. The following describes in detail the semiconductor integrated circuit provided in a second embodiment of the present invention with reference to the accompanying drawings. For the parts the same as or corresponding to those in the foregoing embodiment, refer to the detailed descriptions in the foregoing embodiment. Details are omitted below for simplicity.

Figure 5:
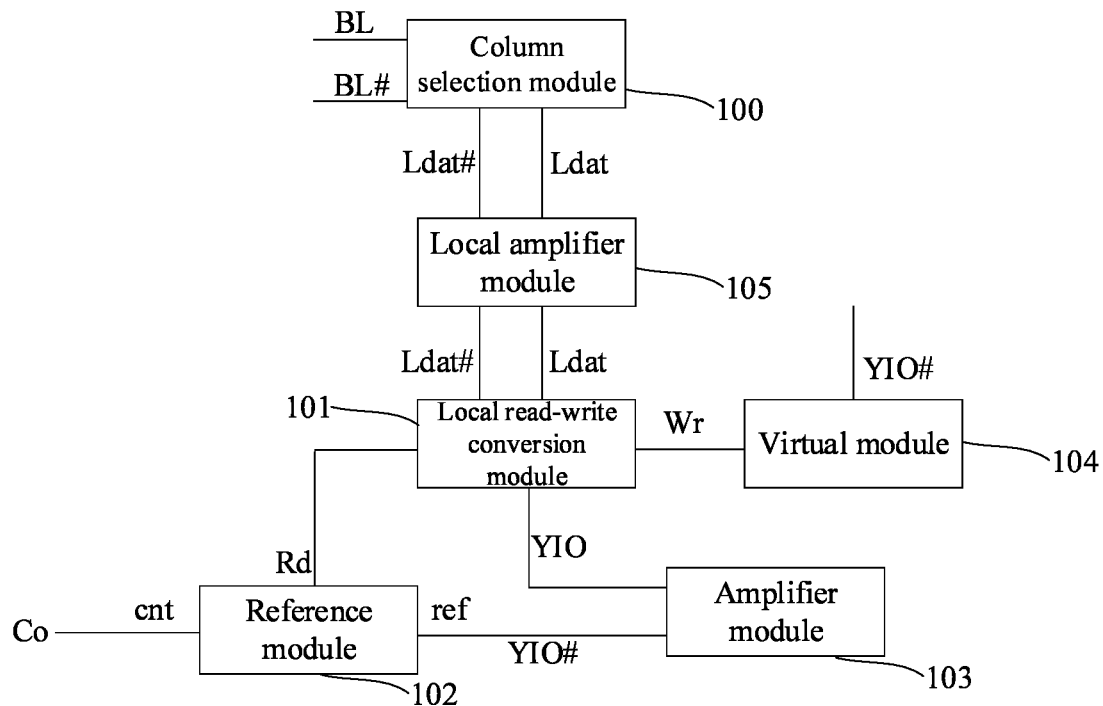
FIG. 5 is a schematic of a semiconductor integrated circuit according to a second embodiment of the present invention.

FIG. 5 is a schematic of a semiconductor integrated circuit according to a second embodiment of the present invention. In this embodiment, the semiconductor integrated circuit is generally same as the semiconductor integrated circuit of FIG. 1. Differences between these two semiconductor integrated circuits can be that a reference signal provided by a reference data line (e.g., a reference data line YIO#) serves as a reference for a second data line (e.g., a second data line YIO), while the reference signal changes. Therefore, sense margins for sense 0 and sense 1 can change over time, thereby improving performance of the semiconductor integrated circuit during a data read operation. Referring to FIG. 5, in some embodiments, the semiconductor integrated circuit can include a first data line Ldat connected or coupled to a bit line BL through a column selection module 100. A first complementary data line Ldat# can be connected or coupled to a complementary bit line BL# through the column selection module 100. In some embodiments, the semiconductor integrated circuit can further include a second data line YIO and a reference data line YIO#. In some embodiments, the semiconductor integrated circuit can further include a local read-write conversion module 101, a reference module 102, an amplifier module 103. The local read-write conversion module 101 can be configured to perform, in response to a read-write control signal, data transmission between the first data line Ldat and the second data line YIO, and data transmission between the first complementary data line Ldat# and the second data line YIO during a data read-write operation. The reference module 102 can be configured to output a reference signal ref to the reference data line YIO#, in response to a read control signal Rd of the read-write control signal. The reference signal ref can serve as a reference for data of the second data line YIO. In some embodiments, the reference module 102 can have a discharge characteristic during a data read operation. In such embodiments, a voltage potential of the reference signal ref can gradually decrease. The amplifier module 103 can be configured to receive data of the second data line YIO and amplify the data of the second data line YIO based on the reference signal ref. The reference signal ref can serve as a reference for amplifying the data of the second data line YIO.

In some embodiments, the second data line YIO of the semiconductor integrated circuit can be a single bus. In such embodiments, data of the second data line YIO can be transmitted in a single-ended transmission manner. Because of the reference module 102, a reference voltage can be provided for determining whether the second data line YIO is at a binary value 1 or 0. During a data read operation, the process that the data of the second data line YIO changes from 1 to 0 is a discharge process. A discharge speed for which the reference module 102 discharges is less than a discharge speed of the read-write conversion module 101.

During a data read operation, whether data of the second data line YIO is at a binary value 1 or 0 needs to be read in a timely and accurate manner. Through the reference module 102, the reference signal ref can be used as a reference for determining whether the data of the second data line YIO is at a binary value 1 or 0. In various embodiments, it may be understood that the data of the second data line YIO being 1 or 0 means the data of the second data line YIO amplified by the amplifier module 103 is 1 or 0.

In some embodiments, during a data read operation, when reading "1", the reference module 102 can cause the reference signal ref to discharge gradually. As such, a voltage potential difference between the second data line YIO and the reference signal ref is no longer fixed but changes over time. During the data read operation, when the second data line YIO changes from a high voltage (e.g., a binary value of 1) to a low voltage (e.g., a binary value of 0), the voltage potential difference between the second data line YIO and the reference signal ref changes over time. Therefore, in such embodiments, sense margins for sense 0 and sense 1 change over time. In this way, the read accuracy of a read operation can be further improved.

In some embodiments, during a read operation, when reading "0", the local read-write conversion module 101 discharges the second data line YIO, at a first discharge speed, to reduce voltage potential of the second data line YIO from a high voltage to a low voltage (that is, in the process that the second data line YIO changes from 1 to 0, where the first level ("1") may be generated in the process of precharging to a high level). During a read operation, the reference module 102 has a second discharge speed, and the second discharge speed is less than the first discharge speed. In this way, it is ensured that the voltage potential of the reference signal ref is always higher than the voltage potential of the data signal of the second data line YIO in the process that the second data line YIO is reduced from the first level to the second level during the read operation. In this way, the accuracy of amplifying the second data line YIO by the amplifier module 103 in the process that the second data line YIO changes from 1 to 0 can be further improved. The reason is, if the potential of the reference signal is lower than the potential of the second data line when the second data line changes from 1 to 0, if the second data line is amplified in this case, the second data line is incorrectly amplified to 1, but the second data line is actually 0.

Figure 6:
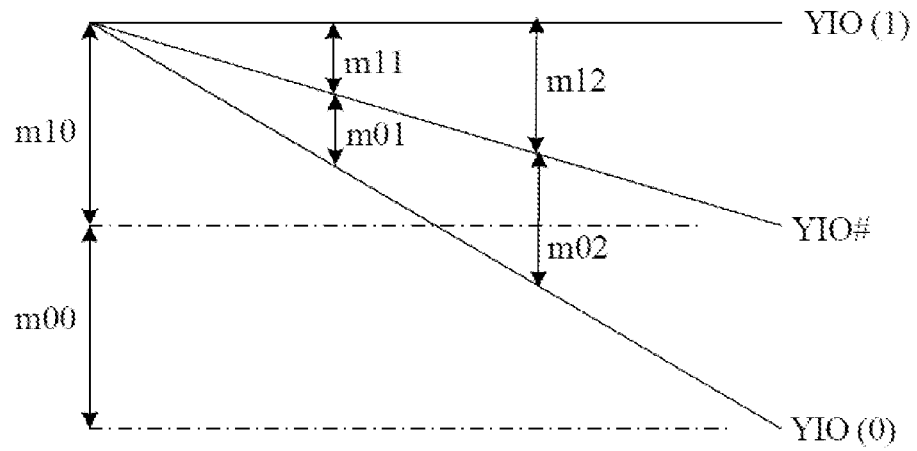
FIG. 6 is a diagram of a voltage potential change of the second data line YIO and the reference data line YIO# during a data read operation.

FIG. 6 is a diagram of a voltage potential change of the second data line YIO and the reference data line YIO# during a data read operation. YIO (1) indicates a voltage potential change when reading a high voltage (e.g., a binary value of 1) on the second data line YIO. YIO (0) indicates a voltage potential change when reading a low voltage (e.g., a binary value of 0) on the second data line YIO. YIO# indicates a voltage potential change of the reference data line. Referring to FIG. 6, for cases where the second data line YIO needs to be read as 1, that is, for sense 1, the second data line YIO needs to remain at 1 or change to 1. Because the reference module 102 has discharge performance, the voltage potential of the reference data line YIO# gradually decreases, and therefore, a sense margin for sense 1 increases over time. For example, the sense margin for sense 1 increases from m11 to m12 over time.

Still referring to FIG. 6, for cases where the second data line YIO needs to be read as 0, that is, for sense 0, the second data line YIO needs to change from 1 to 0 (discharging voltage potential on the second data line YIO). Because the reference module 102 has discharge performance, the voltage potential of the reference data line YIO# gradually decreases. The local read-write conversion module 101 also has discharge performance, therefore, the voltage potential of the second data line YIO also gradually decreases. Because a discharge speed of the reference module 102 is less than a discharge speed of the local read-write conversion module 101, a rate of voltage potential change of the second data line YIO (i.e., YIO (0)) is greater than a rate of voltage potential change of the reference data line YIO#. In other words, compared with the reference data line YIO#, the voltage potential of the second data line YIO is lower, therefore, the voltage potential of the second data line YIO changes to 0 first. Therefore, the second data line YIO is read as 0. In addition, a sense margin for sense 0 (sense margin for 0) increases over time. For example, the sense margin for sense 0 changes from m01 to m02 over time. As such, it follows that during a data read operation, sense margins for sense 0 and sense 1 increase over time to reduce the difference between the sense margins for sense 0 and sense 1.

It should be noted that, during a data read operation, the local read-write conversion module 101 discharges the second data line YIO from a high voltage to a low voltage (i.e., from a binary value of 1 to a binary value of 0). During this data read operation, the reference module 102 discharges the reference data line YIO# from a high voltage to a low voltage (i.e., from a binary value of 1 to a binary value of 0). In general, the sense margin for sense 0 has an ideal sense margin (ideal sense margin for 0), which is referred to as a first ideal sense margin m00. The first ideal sense margin m00 is an absolute value of a voltage potential difference between the reference data line YIO# and the second data line YIO when the second data line YIO discharges during reading of the second data line YIO as 0. The sense margin for sense 1 has an ideal sense margin (ideal sense margin for 1), which is referred to as a second ideal sense margin m10. The second ideal sense margin m10 is an absolute value of a potential difference between the reference data line YIO# and the second data line YIO after the reference module 102 has discharged for a proper time during reading the second data line YIO as 1. In some embodiments, in an ideal case, the first ideal sense margin m00 and the second ideal sense margin m10 can be the same. It may be understood that a circuit of the reference module 102 may be modified to adjust the discharge speed of the reference module 102. Likewise, a circuit of the local read-write conversion module 101 may be modified to adjust the discharge speed of the local read-write conversion module 101. In this way, the first ideal sense margin m00 can be made equal to the second ideal sense margin m00.

In some embodiments, the first ideal sense margin m00 may be less than the second ideal sense margin m00. In some cases, the first ideal sense margin m00 may be greater than the second ideal sense margin m00. In such embodiments, the amplifier module 103 can be configured to amplify data of the second data line YIO based on the second data line YIO and the reference data line YIO#. For example, in some embodiments, the amplifier module 103 can be a differential amplifier having two input ends. The two input ends are respectively connected to the second data line YIO and the reference data line YIO#. Output data of the amplifier module 103 is the data of the second data line YIO amplified. For example, during a data read operation, when the second data line YIO changes from 1 to 0, data (e.g., voltages) of the second data line YIO and the reference data line YIO# are pulled down. However, because a pull-down speed of the second data line YIO is greater than a pull-down speed of the reference data line YIO#, the amplifier module 103 outputs 0.

It may be understood that, for a data read operation, if "1" is being read, the second data line YIO is at a high voltage (e.g., a binary value of 1), and voltage potential of the second data line YIO is higher than voltage potential of the reference data line YIO#. If "0" is being read, during the data read operation, the voltage potential of the second data line YIO is lower than the voltage potential of the reference data line YIO# as the second data line YIO discharges from a high voltage to a low voltage (e.g., a binary value changes from 1 to 0).

Referring back to FIG. 5, in some embodiments, the reference module 102 can include at least one transistor. In such embodiments, the semiconductor integrated circuit can further include a reference control line Co configured to provide a reference control signal cnt to the reference module 102. The reference module 102 can be connected or coupled to the reference control line Co. The reference module 102 can be configured to output the reference signal ref to the reference data line YIO# in response to receiving the read control signal Rd and the reference control signal cnt.

In some embodiments, the read control signal Rd and the reference control signal cnt can jointly affect the reference module 102 to control a discharge speed of the reference module 102. In this way, a relationship between a discharge speed of the local read-write conversion module 101 and the discharge speed of the reference module 102 can be better controlled. In this way, the problem of sense margin inconsistency can be further alleviated. In addition, compared with the conventional method of the reference module 102 responding only to the read control signal Rd, in the solution provided herein, the reference module 102 responds to the read control signal Rd and the reference control signal cnt. This helps to make quantities of transistors of the reference module 102 and the local read-write conversion module 101 consistent. In this way, a difference between the discharge speed of the local read-write conversion module 101 and the discharge speed of the reference module 102 can be controlled more effectively. As such, data of the second data line YIO can be read as 1 or 0 more quickly.

In some embodiments, the reference module 103 may respond only to the read control signal Rd. In other embodiments, the reference module 103 may respond to another control signal in addition to the read control signal Rd and the reference control signal.

In some embodiments, the semiconductor integrated circuit may further include a virtual module 104. The virtual module 104 can receive the write control signal Wr of the read-write control signal. The virtual module 104 can be connected or coupled to the reference data line YIO#. In such embodiments, for cases in which data of the reference data line YIO# is consistent with data of the second data line YIO, the virtual module 104 can make configure the amplifier module 103 for amplification. In various embodiments, the virtual compensation module 104 can have same quantity of transistors as the reference module 102. In various embodiments, the virtual module 104 does not need to participate in data transmission. In some embodiments, the virtual module 104 can be configured to alleviate or offset noise problems caused by the reference module 102, which is conducive to symmetry of layout. In some embodiments, the semiconductor integrated circuit may further include a local amplifier module 105. The local amplifier module 105 can be connected or coupled between the first data line Ldat and the first complementary data line Ldat#. The local amplifier module 105 can be configured to amplify data of the first data line Ldat and data of the first complementary data line Ldat#.

In some embodiments, during a data read operation, the reference module 102 can discharge data of the reference data line YIO# when the reference control signal cnt provided by the reference control line Co is at a high level. In other embodiments, during the data read operation, the reference module 102 may discharge the data of the reference data line YIO# when the reference control signal cnt provided by the reference control line Co is at a low level.

According to the semiconductor integrated circuit provided in this embodiment, the reference signal that changes with the data signal of the second data line YIO can be provided while a number of second data lines is reduced. This helps to ensure the consistency between the sense margin for sense 0 and the sense margin for sense 1. More specifically, both the sense margin for sense 0 and the sense margin for sense 1 increase over time. Therefore, the difference between the sense margin for sense 0 and the sense margin for sense 1 is small, so that the accuracy of amplifying the second data line YOI by the amplifier module 103 is further improved.

In addition, during a data read operation, the discharge speed of the local read-write conversion module 101 in discharging the second data line YIO to changes from 1 to 0 is higher than the discharge speed of the reference module 102 in discharging the reference data line YIO#. This configuration ensures that the second data line YIO changes from 1 to 0 quickly, and the voltage potential of the second data line YIO is always lower than the voltage potential of the reference signal ref. During this time period, regardless of when the amplifier module 103 amplifies the second data line YIO, it can be ensured that the second data line YIO amplified by the amplifier module 103 is 0, so that the accuracy of reading the second data line YIO as 0 is further improved.

A third embodiment of the present invention further provides a semiconductor integrated circuit. The semiconductor integrated circuit provided in this embodiment is roughly the same as the semiconductor integrated circuit of FIG. 5 of the foregoing embodiments. Differences lie in that the reference module 102 of FIG. 5 is further explained in this embodiment. The semiconductor integrated circuit provided in this embodiment is described with reference to the accompanying drawings. For parts that are the same as or corresponding to those in the foregoing embodiments, refer to the detailed descriptions in the foregoing embodiments. Details are omitted below for simplicity.

Figure 7:
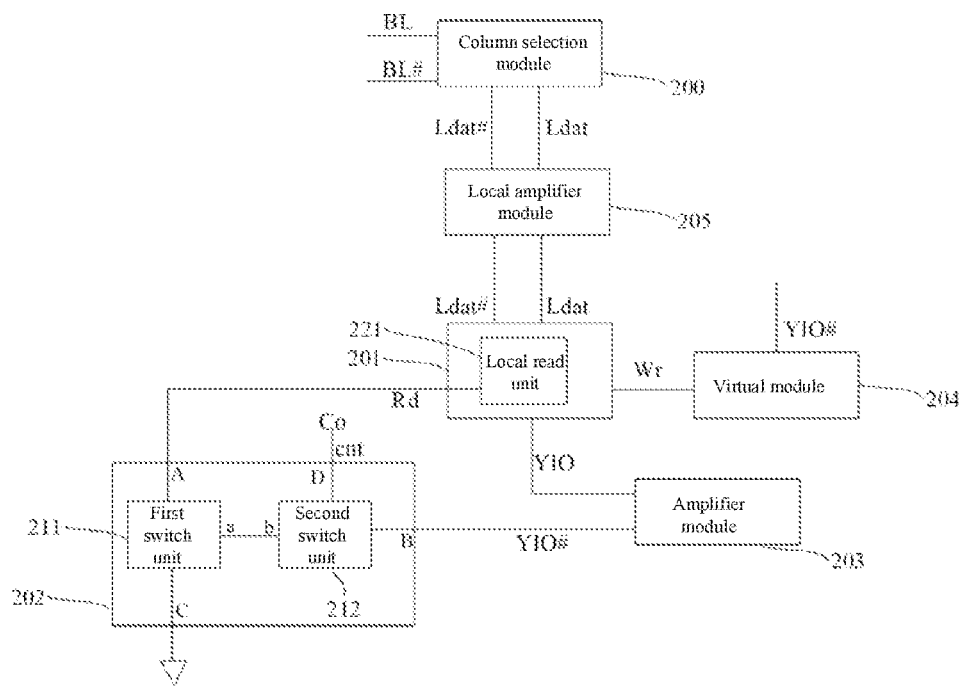
FIG. 7 is a schematic diagram of the semiconductor integrated circuit according to a third embodiment of the present invention.

FIG. 7 is a schematic diagram of the semiconductor integrated circuit according to a third embodiment of the present invention. In some embodiments, the semiconductor integrated circuit can include a column selection module 200, a local read-write conversion module 201, a reference module 202, and an amplifier module 203. In some embodiments, the semiconductor integrated circuit can further include a first data line Ldat connected or coupled to a bit line BL through the column selection module 200 and a first complementary data line Ldat# connected or coupled to a complementary bit line BL# through the column selection module 200. A second data line YIO and a reference data line YIO# can be coupled to the amplifier module 203. The reference module 202 can be configured to output a reference signal to the reference data line YIO# in response to receiving a read control signal Rd and a reference control signal cnt provided by a reference control line Co. The reference signal can serve as a reference for data of the second data line YIO. In some embodiments, the reference module 202 can have a discharge characteristic. During a data read operation, voltage potential of the reference signal B can gradually decrease.

In some embodiments, the semiconductor integrated circuit includes the reference control line Co. In other embodiments, the semiconductor integrated circuit may not include the reference control line Co. In other words, the reference module 202 does not need to respond to the reference control signal cnt. In such embodiments, the reference module 202 can have a first port A, a second port B, a third port C, and a fourth port D. The first port A can receive the read control signal Rd, the second port B can be connected or coupled to the reference data line YIO#, the third port C can be grounded, and the fourth port D can receive the reference control signal cnt. In such embodiments, the reference module 202 can perform discharging between the second port B and the third port C in response to the read control line signal Rd and the reference control signal cnt to gradually reduce voltage potential of the reference data line YIO#. For example, during a data read operation, the read control signal Rd is at a high level and the reference control signal cnt is also at a high level. In this example, the reference module 202 becomes conductive and performs discharging between the second port B and the third port C. In other words, the voltage potential of the reference data line YIO# is pulled down to 0. In such embodiments, the second switch unit can be an NMOS. In some embodiments, during a data read operation, when the read control signal Rd is at a high level and the reference control signal cnt is at a low level, the reference module 202 becomes and performs discharging between the second port B and the third port C, in other words, the potential of the reference data line YIO# is pulled down to 0. In such embodiments, the second switch unit can be a PMOS.

It may be understood that the working principle is described based on a condition for performing a data read operation when the read control signal Rd is at a high voltage. Certainly, when the condition for performing the read operation is that the read control signal is at a low voltage, "the read control signal Rd is at a high voltage" in the foregoing working principle may be replaced with "the read control signal Rd is at a low voltage".

In some embodiments, the reference module 202 can include a first switch unit 211 and a second switch unit 212. The first switch unit 211 can be connected or coupled to the first port A and the third port C. The first switch unit 211 can have a first node a, and the first switch unit 211 can become conductive, in response to receiving the read control signal Rd, to connect or couple the first node a to the third port C. The second switch unit 212 can be connected or coupled to the second port B and the fourth port D. The second switch unit 212 can have a second node b that is connected or coupled to the first node a. The second switch unit 212 can become conductive, in response to receiving the reference control signal cnt, to connect or couple the second port B to the second node b. In this way, the second port B can be grounded through the first switch unit 211 and the second switch unit 212. Therefore, data of the reference data line YIO# can be pulled down to 0.

In some embodiments, the first switch unit 211 can connect or couple the first node to the third port C to form a conductive path to the ground in response to receiving the read control signal Rd. Likewise the second switch unit 212 can connect or couple the second node b to the second port B to form a conductive path in response to receiving the reference control signal cnt. In some embodiments, the first switch unit 211 can include at least one transistor. The second switch unit 212 can include at least one transistor. In various embodiments, the transistors associated with the first switch unit 211 or the second switch unit 212 may be a PMOS transistor or an NMOS transistor.

In some embodiments, when the reference module 202 is responsive only to the read control signal Rd, the reference module 202 includes only the first switch unit 211. In such embodiments, during a data read operation, the local read-write conversion module 201 has a discharge speed such that data of the second data line YIO is reduced from a high voltage to a second voltage (e.g., a binary value changes from 1 to 0). The reference module 202 has a discharge speed that is less than the first discharge speed of the local read-write conversion module 201, so that voltage potential of the reference signal ref is higher than voltage potential of the second data line YIO as data of the second data line YIO is reduced from the high voltage to the second voltage during the data read operation.

In some embodiments, the local read-write conversion module 201 can include a local read unit 221. In such embodiments, the discharge speed of the local read-write conversion module 201 corresponds to a discharge speed of the local read unit 221. The local read unit 221 can transmit data of the first data line Ldat or the first complementary data line Ldat# to the second data line YIO during a data read operation in response to the read control signal Rd in the read-write control signal. In some embodiments, the local read unit 221 can include a plurality of transistors. In some embodiments, the local read unit 221 can include at least two local transistors, the reference module 202 includes at least one reference transistor, and a conductivity of the at least one reference transistor is weaker than conductivities of the local transistors. In this way, a discharge speed of the reference module 202 is less than the discharge speed of the local read unit 221. In general, the stronger a conductivity of a transistor, the higher a corresponding discharge speed for the transistor, and the weaker a conductivity of a transistor, the lower a corresponding discharge speed for the transistor.

In some embodiments, the transistors of the local read unit 221 can be PMOS transistors or NMOS transistors. It may be understood that a transistor type of the local read unit 221 is the same as a transistor type of the reference module 202. For example, both of the transistors can be PMOS transistors, NMOS transistors, or a combination of PMOS and NMOS transistors.

In some embodiments, the discharge speed of the local read unit 221 can be related to a number of transistors in the local read unit 221 and characteristics of the transistors. Similarly, the discharge speed of the reference module 202 can be related to a number of transistors in the reference module 202 and characteristics of the transistors. In various embodiments, the characteristics of the transistors can include channel widths of the transistors. In some embodiments, the quantity of transistors of the reference module 202 may be the same as the quantity of transistors of the local read unit 221, and a channel width of the transistors of the reference module 202 is less than a channel width of the transistors of the local read unit 221. In some embodiments, the channel width of the transistors of the reference module 202 can be less than or equal to ⅔ of the channel width of the transistors of the local read unit 221. For example, in some embodiments, the channel width of the transistors of the reference module 202 may be ½ of the channel width of the transistors of the local read unit 221. In this way, it can be ensured that the discharge speed of the reference module 202 is less than the discharge speed of the local read-write conversion module 201. Certainly, a person skilled in the art should understand that different discharge speeds may also be set by designing different performance parameters such as threshold gate voltages.

In some embodiments, the semiconductor integrated circuit may further include a virtual module 204 and a local amplifier module 205. For detailed descriptions of the virtual module 204 and the local amplifier module 205, refer to the foregoing embodiments discussed with respect to FIG. 5. Details are omitted herein for simplicity.

In some embodiments, before a data read operation is performed, the reference data line YIO# may be precharged to be at a high voltage. During the data read operation, when the second data line YIO changes from 0 to 1 or remains at 1, the reference module 202 becomes conductive and a conductive path is formed to the ground through the second switch unit and the first switch unit, thereby discharging voltage potential of the reference data line YIO# to a low voltage (i.e., the reference data line YIO# is pulled down to 0). In the voltage potential pull-down process, voltage potential differences between the reference data line YIO# and the second data line YIO gradually increases, and therefore, the sense margin for sense 1 of the amplifier module 203 gradually increases. In addition, as the voltage potential differences between the reference data line YIO# and the second data line YIO becomes larger, it is less difficult to read the data of the second data line YIO as 1.

In some embodiments, during a data read operation, when the second data line YIO changes from 0 to 1, becomes conductive and a conductive path is formed to the ground through the second switch unit and the first switch unit, thereby discharging voltage potential of the reference data line YIO# to a low voltage (i.e., the reference data line YIO# is pulled down to 0). In addition, the local read-write conversion module 201 can also discharge, that is, voltage potential of the second data line YIO is pulled down from 1 to 0. In such embodiments, the discharge speed of the local read-write conversion module 201 is greater than the discharge speed of the reference module 202. Therefore, comparing with the reference data line YIO#, the potential of the second data line YIO is pulled down to 0 quicker, and voltage potential difference between the reference data line YIO# and the second data line YIO becomes larger. Because the reference signal ref serves as a reference, it is less difficult to read the second data line YIO as 0. In addition, in the voltage pull-down process, the voltage potential difference between the reference data line YIO# and the second data line YIO gradually increases, and therefore, the sense margin for sense 0 gradually increases. As such, during a data read operation, the sense margins for sense 0 and sense 1 can increase over time. This avoids the problem that the differences between the sense margins for sense 0 and sense 1 becoming too large over time.

In general, data of the second data line YIO remaining at 1 means that the second data line YIO has been precharged to a high voltage before performing a data read operation. Therefore, the second data line YIO is at 1 before the data read operation. When data of the first data line Ldat is transmitted to the second data line YIO and the first data line Ldat is 1, the second data line YIO remains at 1 during the data read operation.

A fourth embodiment of the present invention further provides a semiconductor integrated circuit. The semiconductor integrated circuit provided in this embodiment is roughly the same as the semiconductor integrated circuit in the foregoing embodiments. Differences lie in that specifics of the local read conversion module and the reference module are further described in detail in this embodiment. The following describes the semiconductor integrated circuit provided in this embodiment with reference to the accompanying drawings. For the parts the same as or corresponding to those in the foregoing embodiments, refer to the detailed descriptions in the foregoing embodiments. Details are omitted below for simplicity.

Figure 8:
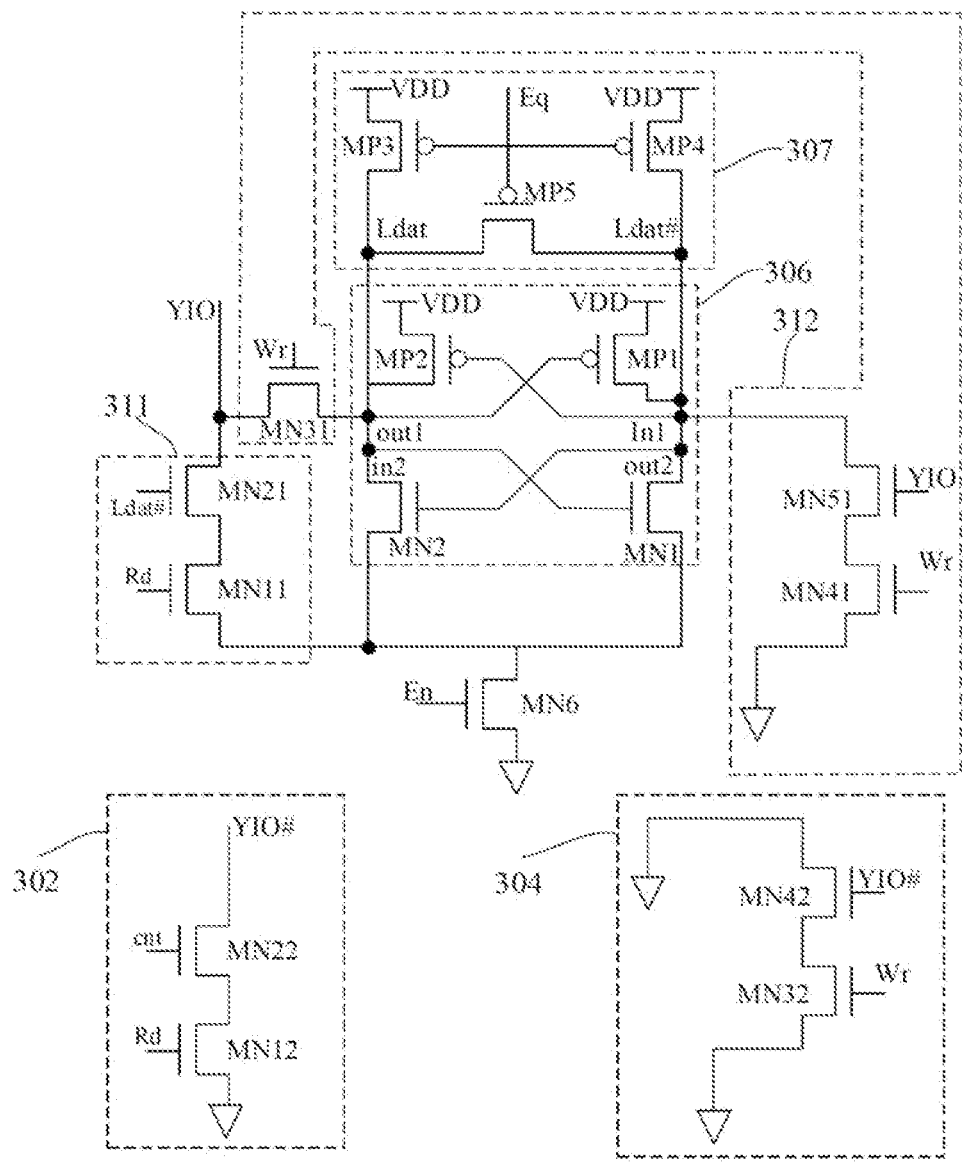
FIG. 8 is an electrical schematic of a semiconductor integrated circuit according to a fourth embodiment of the present invention.

FIG. 8 is an electrical schematic of a semiconductor integrated circuit according to a fourth embodiment of the present invention. A part of the circuit shown in FIG. 8 is the same as the circuit shown in FIG. 2. Referring to FIG. 8, in some embodiments, the semiconductor integrated circuit can include a first data line Ldat, a first complementary data line Ldat#, a second data line YIO, a reference control line Co, and a reference data line YIO#. The semiconductor integrated circuit can further include a local read-write conversion module (not shown in FIG. 8), a reference module 302, and an amplifier module 303, During a data read operation, the local read-write conversion module can discharge voltage potential of the second data line YIO from a high voltage to a low voltage at a discharge speed. The reference module 302 can be configured to output a reference signal ref to the reference data line YIO# in response to a read control signal Rd of a read-write control signal. A reference control signal cnt can be provided by the reference control line Co to serves as a reference for data of the second data line YIO. During the data read operation, the reference module 302 a second discharge speed that is less than the discharge speed of the local read-write conversion module; and an amplifier module 303.

The following describes in detail the semiconductor integrated circuit provided in this embodiment with reference to the accompanying drawings. It should be noted that for the same parts in FIG. 8 and FIG. 2, refer to the detailed descriptions in the foregoing embodiments. Details are omitted below for simplicity. In this embodiment, the local read-write conversion module includes a local read unit 311, configured to transmit data of the first data line Ldat or the first complementary data line Ldat# to the second data line YIO during a data read operation in response to the read control signal Rd of the read-write control signal.

During a data read operation, both the reference module 302 and the local read unit 311 can have discharge speeds. The discharge speed of the reference module 302 can be less than the discharge speed of the local read unit 311. To simplify the circuit and reduce the layout design difficulty, a circuit of the reference module 302 is similar to a circuit structure of the local read unit 311. In this way, it ensures that the discharge speed of the reference module 302 is less than the discharge speed of the local read unit 311. For example, in some embodiments, the local read unit 311 can include at least two local transistors and the reference module 302 can include at least one reference transistor. In such embodiments, to have different discharge speeds, a channel width of the at least one reference transistor is less than a channel width of the local transistors. In some embodiments, a type of the local transistors can be the same as that of the reference transistor. In some embodiments, both the type of the local transistors and the type of the reference transistor can be N-type, that is, all the local transistors are NMOS transistors, or in some cases, just the reference transistor is an NMOS transistor while the local transistors are PMOS transistors. In some embodiments, the channel width of the reference transistor is less than the channel width of the local transistors. For example, the channel width of the reference transistor is ½ of the channel width of the corresponding local transistor. In some embodiments, the channel width of the reference transistor may be greater than or equal to the channel width of the local transistors. This ensures that the discharge speed of the reference module 302 and the discharge speed of the local read unit both meet memory performance requirements. In some embodiments, a number of local transistors is the same as a number of reference transistors. For example, in some embodiments, the local transistors can include a local read control transistor MN11 configured to turn ON (i.e., to conduct) in response to receiving the read control signal Rd. A local read transmission transistor MN21 can be configured to turn ON (i.e., to conduct) in response to receiving data of the first complementary data line Ldat#. In some embodiments and a source of the local read control transistor MN11 can be grounded, a drain of the local read control transistor MN11 can be connected or coupled to a source of the local read transmission transistor MN21. A drain of the local read transmission transistor MN21 can be connected or coupled to the second data line YIO. The at least one reference transistor can be a reference control transistor MN12 configured to be conductive in response to receiving the read control signal Rd to cause the reference data line YIO# to be grounded through the reference control transistor MN12. In some embodiments, a channel width of the reference control transistor MN12 can be less than a channel width of the local read control transistor MN11.

In some embodiments, the at least one reference transistor can further include a reference transmission transistor MN22 configured to be conductive in response to the reference control signal cnt to cause the reference data line YIO# to be grounded through the reference control transistor MN12. In some embodiments, the reference transmission transistor MN22 can have a channel width that is less than a channel width of the local read transmission transistor MN21. In some embodiments, a source of the reference control transistor MN12 can be grounded and a drain of the reference control transistor MN12 can be connected or coupled to a source of the reference transmission transistor MN22. A gate of the reference transmission transistor MN22 can be connected or coupled to the reference control line Co, and a drain of the reference transmission transistor MN22 can be connected or coupled to the reference data line YIO#. In some embodiments, both the reference control transistor MN12 and the local read control transistor MN12 can be NMOS transistors. In some embodiments, the channel width of the reference control transistor MN12 can be less than or equal to ⅔ of the channel width of the local read control transistor MN12. In some embodiments, the channel width of the reference transmission transistor MN22 can be less than or equal to ⅔ of the channel width of the local transmission transistor MN21. In some embodiments, the channel width of the reference control transistor MN12 can be ½ of the channel width of the local read control transistor MN11 and the channel width of the reference transmission transistor MN22 can be ½ of the channel width of the local read transmission transistor MN21. In this way, the discharge speed of the reference module 302 can be ½ of the discharge speed of the local read conversion module 301.

In some embodiments, a relationship between the discharge speed of the reference module 302 and the discharge speed of the local read conversion module 301 can be proportionally adjusted based on actual needs. In other words, a proportion relationship between the channel width of the reference control transistor and the channel width of the local read control transistor may be properly adjusted, and proportions between the channel width of the reference transmission transistor and the channel width of the local read transmission transistor may be adjusted. For example, the channel width of the reference control transistor may be ⅓ or ¼ of the channel width of the local read control transistor, and the channel width of the reference transmission transistor may be ⅓ or ¼ of the channel width of the local read transmission transistor. Many variations are possible.

In some embodiments, positions of the reference control transistor MN12 and the reference transmission transistor MN22 in the semiconductor integrated circuit may be interchangeable. For example, the gate of the reference control transistor MN12 receiving the reference control signal cnt and the reference control transistor MN12 becoming conductive in response to receiving the reference control signal cnt, and the gate of the reference transmission transistor MN22 receiving the read control signal Rd and the reference transmission transistor MN22 conducting in response to receiving the read control signal Rd may be interchangeable.

In some embodiments, the reference module 302 may include only one reference transistor, a gate of the reference transistor receives the read control signal, and the channel width of the reference transistor is properly set to ensure that the discharge speed of the reference module 302 and the discharge speed of the local read-write conversion module 301 meet memory performance requirements.

In some embodiments, the semiconductor integrated circuit can further include a virtual module 304. The virtual module 304 can receive a write control signal Wr of the read-write control signal. The virtual module 304 can be connected or coupled to the reference data line YIO#. A number of transistors of the virtual module 304 can be the same as a number of transistors of the reference module 302. In some embodiments, the virtual module 304 can include a virtual control transistor MN32 and a virtual transmission transistor MN42. A gate of the virtual control transistor MN32 can receive the write control signal Wr, and one port of the virtual control transistor MN32 can be grounded. A gate of the and a virtual transmission transistor MN42 can be connected or coupled to the reference data line YIO# and the other port of the virtual control transistor MN32 can be connected or coupled to one port of the virtual transmission transistor MN42. The other port of the virtual transmission transistor MN42 can be grounded. In some embodiments, both the virtual control transistor MN32 and the virtual transmission transistor MN42 can be NMOS transistors. In general, a circuit of the virtual compensation module 304 can be similar to a circuit of the local write transmission transistor MN51 and the second local write control transistor MN41 in the local write unit 312. The virtual transmission transistor MN42 and the virtual control transistor MN32 can be connected or coupled between two ground terminals. Therefore, the virtual module 304 actually does not participate in data transmission. Through the virtual module 304, for cases of voltage potential of the reference data line YIO# being basically consistent with voltage potential of the second data line YIO, a noise problem can be alleviated or offset. As a result, the accuracy of amplification result of the amplifier module can be improved, the layout can be symmetric, and the layout difficulty can be reduced.

In some embodiments, the local read-write conversion module further includes a local write unit 312. The local write unit 312 can be configured to transmit data of the second data line YIO to the first data line Ldat or the first complementary data line Ldat# during a data write operation in response to the write control signal Wr in the read-write control signal. For detailed descriptions of the local write unit 312, refer to the corresponding descriptions in the foregoing embodiments.

In some embodiments, the semiconductor integrated circuit can further include a local amplifier module 306. The local amplifier module 306 can be connected or coupled between the first data line Ldat and the first complementary data line Ldat#. The local amplifier module 306 can be configured to amplify data of the first data line Ldat and data of the first complementary data line Ldat#.

In some embodiments, the semiconductor integrated circuit can further include an enable NMOS transistor MN6. A gate of the enable NMOS transistor MN6 can receive an enable signal En and a source of the enable NMOS transistor MN6 can be grounded. A first phase inverter and a second phase inverter can be further connected to a drain of the enable NMOS transistor MN6. A source of the first NMOS transistor MN1 and a source of the second NMOS transistor MN2 can be connected to the drain of the enable NMOS transistor MN6.

In some embodiments, the semiconductor integrated circuit can further include a precharging module 307. The precharging module 307 can be connected or coupled between the first data line Ldat and the first complementary data line Ldat#. The precharging module 307 can be configured to precharge the first data line Ldat and the first complementary data line Ldat# line in response to a precharging control signal Eq. For detailed descriptions of the local amplifier module 306, the enable NMOS transistor MN6, and the precharging module 307, refer to the corresponding descriptions in the foregoing embodiments. Details are omitted herein for simplicity.

Before a data read operation is performed, the second data line YIO and the reference data line YIO# are precharged to a high voltage. When the read control signal Rd is at a high voltage, the data read operation is performed. The first data line Ldat is at a high voltage, the first complementary data line Ldat# is at a low voltage. As a result, the local read control transistor MN11 is turned ON and the local read transmission transistor MN21 is turned ON. As such, a conductive channel from the second data line YIO# to the ground is cut off. Therefore, the second data line YIO# remains at a high voltage. When the reference control signal cnt provided by the reference control line Co is at a high voltage, the reference control transistor MN12 is turned ON, and the reference transmission transistor MN22 is also turned ON. Therefore, a channel from the reference data line YIO# to the ground becomes conductive. The reference data line YIO# then discharges to the ground through the reference control transistor MN12 and the reference transmission transistor MN22. Therefore, the potential of the reference data line YIO# becomes lower and gradually changes to 0, and voltage potential difference between the reference data line YIO# and the second data line YIO becomes larger. The voltage potential of the reference data line YIO# can serve as a reference, so that the amplifier module 303 can amplify the second data line YIO to 1 in an accurate and timely manner. In addition, during discharging, a sense margin for sense 1 of the second data line YIO becomes larger, instead of being fixed. Similarly, when the read control signal Rd is at a high voltage, the data read operation is performed. The first data line Ldat is at a low voltage, the first complementary data line Ldat# is at a high voltage, both the local read control transistor MN11 and the local read transmission transistor MN21 are turned ON, and a channel from the second data line YIO to the ground becomes conductive. Therefore, the second data line YIO discharges to the ground through the local read control transistor MN11 and the local read transmission transistor MN21, and the voltage potential of the second data line YIO becomes lower and lower until it changes to 0. When the reference control signal cnt provided by the reference control line Co is at a high voltage, and the reference control transistor MN12 and the reference transmission transistor MN22 are turned ON. Therefore, a channel from the reference data line YIO# to the ground becomes conductive. The reference data line YIO# discharges to the ground through the reference control transistor MN12 and the reference transmission transistor MN22, so that the voltage potential of the reference data line YIO# becomes lower and lower and gradually changes to 0. Because the discharge speed of the reference data line YIO# to the ground is less than the discharge speed of the second data line YIO to the ground, the second data line YIO is always closer to 0 than the reference data line YIO#, that is, the voltage potential of the second data line YIO is always lower than the voltage potential of the reference data line YIO#. As such, the voltage potential of the reference data line YIO# can serve as a reference, so that the amplifier module 303 can effectively and accurately amplify the second data line YIO to 0 in a timely manner. In addition, during discharging, a sense margin for sense 0 of the second data line YIO becomes larger. Therefore, the sense margins for sense 0 and sense 1 of the second data line YIO become larger, to avoid a case that a sense margin for sense 0 becomes larger while a sense margin for sense 1 remains unchanged.

Figure 9:
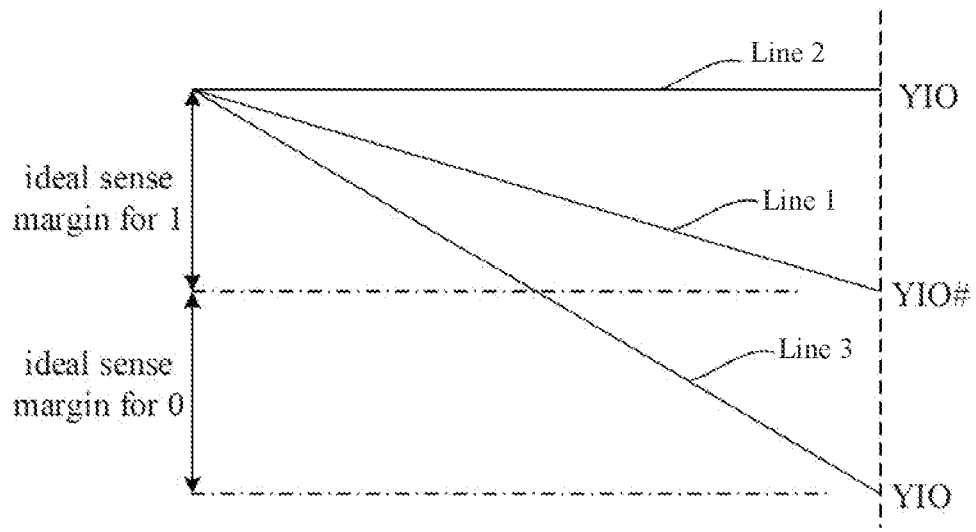
FIG. 9 is a schematic of a voltage potential change of the reference data line according to an embodiment of the present invention.

FIG. 9 is a schematic of a voltage potential change of the reference data line according to an embodiment of the present invention. In FIG. 9, a line 1 is a voltage potential change of the reference data line YIO# over time, a line 2 is a voltage potential change of the second data line YIO over time during reading 1, and a line 3 is a voltage potential change of the second data line YIO over time during reading 0. A slope of the line 1 corresponds to the discharge speed of the reference module, and a slope of the line 3 correspond to the discharge speed of the local read-write conversion module. As shown in FIG. 9, the sense margin for reading 0 (namely, sense 0) by the semiconductor integrated circuit and the sense margin for reading 1 (namely, sense 1) by the semiconductor integrated circuit 1 can increase over time. A maximum sense margin for sense 0 is a first ideal sense margin (ideal sense margin for 0) and a maximum sense margin for sense 1 is a second ideal sense margin (ideal sense margin for 1). The discharge speed of the reference module and the discharge speed of the local read-write conversion module can be adjusted to ensure that the first ideal sense margin is equal to the second ideal sense margin, thereby further improving memory read performance.

It should be noted that the foregoing embodiment is described in detail by using an example in which the semiconductor integrated circuit includes the reference control line Co. In some embodiments, the semiconductor integrated circuit may not include the reference control line Co. In such embodiments, the reference module does not need to respond to the reference control signal, and a corresponding reference transistor may not include the reference transmission transistor.

Figure 10:
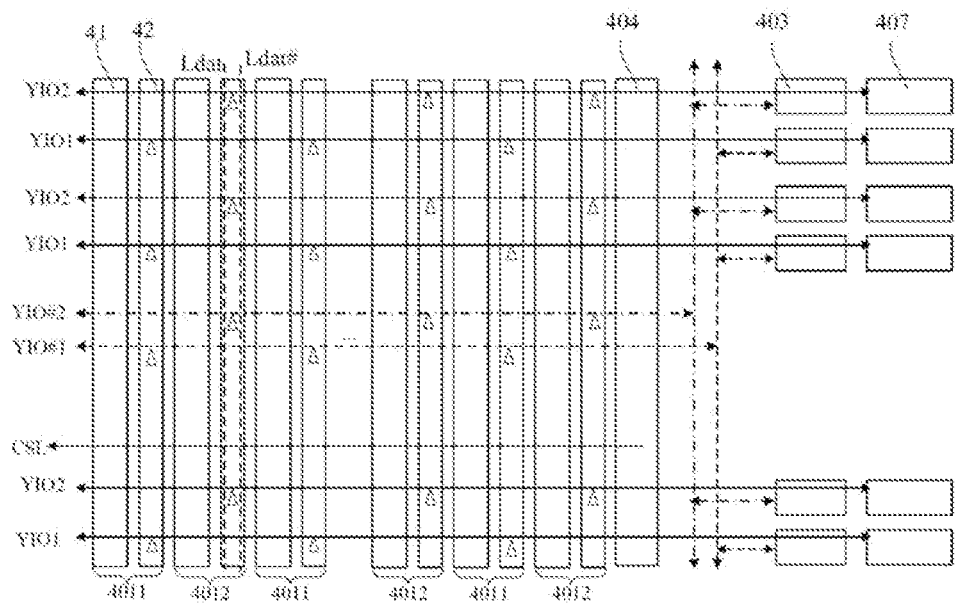
FIG. 10 is a schematic diagram of a memory according to an embodiment of the present invention.

FIG. 10 is a schematic diagram of a memory according to an embodiment of the present invention. Referring to FIG. 10, in some embodiments, the memory can include a plurality of memory cell arrays and a plurality of sense amplifier arrays that are alternately arranged. Each of the plurality of memory cell arrays can be connected or coupled to at least one of the plurality of sense amplifier arrays to form a memory array. Each first data line Ldat and each first complementary data line Ldat# of the foregoing embodiments of the semiconductor integrated circuit discussed above can be connected or coupled to a memory cell array (e.g., a memory cell array 41) through a corresponding sense amplifier array (e.g., a sense amplifier array 42) to perform a read-write operation on the memory cell array. In some embodiments, the read-write operation can be performed through at least one local read-write conversion module of the memory cell array. In some embodiments, the memory can further include an amplifier module 403, a column decoding circuit 404, and a decoding selection signal line CSL. The decoding selection signal line CSL can be connected or coupled to the column decoding circuit 404 and a memory cell array, so that the column decoding circuit 404 can select one or more memory cells from the memory cell array to perform read-write operations.

In FIG. 10, a triangle can represent an electrical connection. Dashed lines can indicate a first data line Ldat and a first complementary data line Ldat# that are connected or coupled to the sense amplifier array 42. First data lines and first complementary data lines that are connected or coupled to other sense amplifier arrays are not shown.

In some embodiments, each memory array of the memory can include at least one memory cell array (e.g., the memory cell array 41) and at least one sense amplifier array (e.g., the sense amplifier array 42). The memory cell array can include a plurality of storage elements configured to store data. The sense amplifier array can be configured to amplify data of the memory cell array. Because data of the memory cell array is transmitted in a single-phase manner, a number of data lines to perform read-write operations on the memory cell array can be reduced. In general, the quantity of data lines, therefore, can be reduced from 2N in under conventional technology to just N.

In some embodiments, the memory can include a plurality of first group of sense amplifier arrays 4011 in odd columns of memory cell arrays and a plurality of second group of sense amplifier arrays 4012 in even columns of memory cell arrays. For ease of illustration, in FIG. 10, a first group of sense amplifier arrays 4011 includes a memory cell array (e.g., the memory cell array 41) connected or coupled to a sense amplifier array (e.g., the sense amplifier array 42) in odd columns of memory cell arrays, and a second group of sense amplifier arrays 4012 includes a memory cell array connected or coupled to a sense amplifier array in even columns of memory cell arrays.

In some embodiments, the second data line YIO of the foregoing embodiments of the semiconductor integrated circuit discussed above can comprise a first group of data lines YIO1 corresponding to a first group of sense amplifier arrays 4011, and a second group of data lines YIO2 corresponding to a second group of sense amplifier arrays 4012. In some embodiments, the first group of data lines YIO1 can correspond to a first data line Ldat and a first complementary data line Ldat# that are connected or coupled to the first group of sense amplifier arrays 4011. Similarly, the second group of data lines YIO2 can correspond to a first data line Ldat and a first complementary data line Ldat# that are connected to the second group of sense amplifier arrays 4012.

In some embodiments, the reference data line of the foregoing embodiments of the semiconductor integrated circuit discussed above can comprise a first reference data line YIO#1 configured to provide a first reference signal, and a second reference data line YIO#2 configured to provide a second reference signal. For ease of illustration, in FIG. 10, a dotted line is used to indicate the first reference data line YIO#1 and a dashed line is used to indicate the second reference data line YIO#2. The reference module of the foregoing embodiments of the semiconductor integrated circuit discussed above can includes a first reference unit and a second reference unit. The first reference unit can be adapted to output a first reference signal to the first reference data line YIO#1 to be used as a reference for data of the first group of data lines YIO1. The second reference unit can be adapted to output a second reference signal to the second reference data line YIO#2 to be used as a reference for data of the second group of data lines YIO2.

In some embodiments, the amplifier module of the foregoing embodiments of the semiconductor integrated circuit discussed above can include a first group of amplifier modules and a second group of amplifier modules. The first group of amplifier modules can be configured to receive the first reference signal and data of the first group of data lines YIO1, and amplify the data of the first group of data lines YIO1. The second group of amplifier modules can be configured to receive the second reference signal and data of the second group of data lines YIO2, and amplify the data of the second group of data lines YIO2. The first group of amplifier modules can amplify the first group of data lines YIO1 connected or coupled to the plurality of first group of sense amplifier arrays 4011. Likewise, the second group of amplifier modules can amplify the second group of data lines YIO2 connected or coupled to the plurality of second group of sense amplifier arrays 4012.

In some embodiments, the memory can further include global write control circuits. The global write control circuits can be connected or coupled to various second data lines. For example, a global write control circuit 407 can be connected or coupled to the first group of data lines YIO1, and a second global write control circuit can be connected or coupled to the second group of data lines YIO2.

Figure 11:
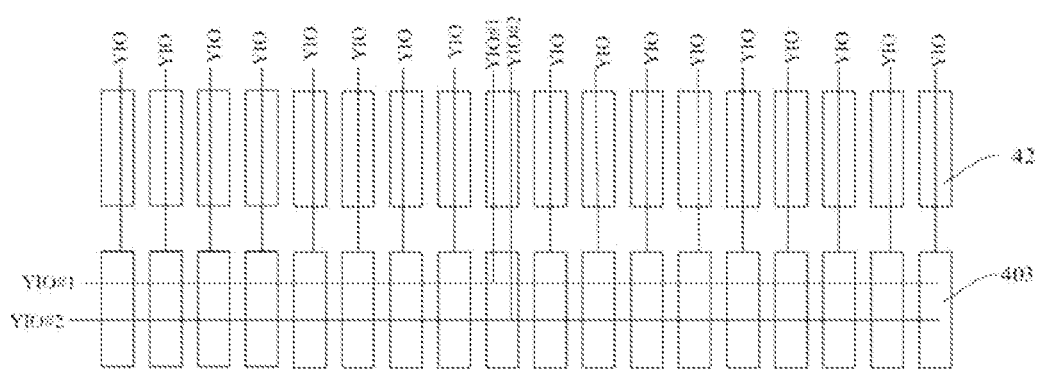
FIG. 11 is a schematic diagram of the memory according to an embodiment of the present invention.

FIG. 11 is a schematic diagram of the memory according to an embodiment of the present invention. FIG. 11 depicts the memory in a 90° clockwise rotation from FIG. 10. As shown in FIG. 11, one half of a plurality of second data lines YIO is located on one side of the first reference data line YIO#1 and the second reference data line YIO#2, and the other half of the plurality of second data lines YIO is located on the other side of the first reference data line YIO#1 and the second reference data line YIO#2. As such, the first reference data line YIO#1 and the second reference data line YIO#2 are arranged in a middle (e.g., a center) of all the second data lines YIO. In this way, path lengths from positions of a sense amplifier array (e.g., the sense amplifier array 42 of FIG. 10) to the amplifier module at the end of the second data lines YIO are basically consistent, thereby alleviating problems of power loss due to parasitics caused by inconsistent path lengths and further improving performance of the memory.

In some embodiments, the first group of amplifier modules can correspond to sense amplifier arrays (e.g., the sense amplifier array 42 of FIG. 10) in odd columns of memory cell arrays. The second group of amplifier modules can correspond to sense amplifier arrays in even columns of memory cell arrays. In such embodiments, the first group of amplifier modules in the odd columns share the same first reference data line YIO#1. Likewise, the second group of amplifier modules in the even columns share the same second reference data line YIO#2.

The memory provided in the forgoing embodiments may be a DRAM such as a DDR3 DRAM, a DDR4 DRAM, or a DDR5 DRAM. In some embodiments, the memory may be a SRAM, an MRAM, an FeRAM, a PCRAM, a NAND memory, a NOR memory, or the like.

A person of ordinary skill in the art may understand that the foregoing embodiments are specific implementations of the present invention. In actual applications, various changes may be made to the implementations in terms of forms and details without departing from the spirit and scope of the present invention. Any person skilled in the art may make changes and modifications without departing from the spirit and scope of the present invention. Therefore, the protection scope of the present invention shall be subject to the scope of the claims.

What is claimed is:

1. A semiconductor integrated circuit of a memory, comprising:
   a first data line coupled to a bit line through a column selection module, a first complementary data line coupled to a complementary bit line through the column selection module, a second data line, and a reference data line configured to provide a reference signal;
   a local read-write conversion module configured to perform, during a memory read-write operation, in response to a read-write control signal, data transmission from at least one of the first data line or the first complementary data line to the second data line;
   an amplifier module configured to amplify data of the second data line based on the reference signal of the reference data line, wherein the reference signal serves as a reference for amplifying the data of the second data line; and
   a reference module to output the reference signal to the local read-write conversion module in response to receiving a read control signal of the read write control signal,
   wherein the reference module is configured to reduce voltage potential of the reference signal during a memory read operation, and
   wherein the local read-write conversion module is configured to reduce voltage potential of second data line during the memory read operation, wherein a discharge speed of the local read-write conversion module is greater than a discharge speed of the reference module.

2. The semiconductor integrated circuit of claim 1, wherein the reference signal has a fixed voltage potential.

3. The semiconductor integrated circuit of claim 1,
   wherein the reference module comprises at least one reference transistor.

4. The semiconductor integrated circuit of claim 3, further comprising:
   a reference control line configured to provide a reference control signal to the reference module, wherein the reference module outputs the reference signal to the local read-write conversion module in response to the reference control signal and the read control signal of the read write control signal.

5. The semiconductor integrated circuit of claim 4, wherein:
   the reference module includes a first port, a second port, a third port, and a fourth port;
   the first port is coupled to the read control signal, the second port is coupled to the reference signal, the third port is coupled to a ground, and the fourth port coupled to the reference control signal; and
   the reference module discharges the voltage potential of the of the reference signal during the memory read operation through the second port and the third port.

6. The semiconductor integrated circuit of claim 5, wherein the reference module comprises a first switch unit and a second switch unit, wherein:
the first switch unit includes a first node and is coupled between the second switch unit and the ground, wherein the first switch unit is configured to form a conductive pathway between the first node to the third port in response to the reference module receiving the read control signal; and
the first switch unit includes a second node and is coupled between the second port and the fourth port, wherein the second switch unit is configured to form a conductive pathway between the second port and the second node in response to the reference module receiving the reference control signal.

7. The semiconductor integrated circuit of claim 3, wherein the local read-write conversion module includes a local read unit configured to transmit data of at least one of the first data line or the first complementary data line to the second data line during the memory read operation and in response to the local read-write conversion module receiving the read control signal of the read write control signal, wherein the local read unit comprises at least two local transistors and a conductivity of the at least two local transistor is stronger than a conductivity of the at least one reference transistor.

8. The semiconductor integrated circuit of claim 7, wherein a channel width of the at least one reference transistor is less than a channel width of the at least two local transistors.

9. The semiconductor integrated circuit of claim 7, wherein the at least two local transistors include a local read control transistor and a local read transmission transistor, wherein the local read control transistor and the local read transmission transistor from a conductive pathway between the second data line and a ground to discharge the voltage potential of the second data line, wherein the local read control transistor and the local read transmission transistor from the conductive pathway in response to the local read-write conversion module receiving the reference control signal and the read control signal of the read write control signal, respectively.

10. The semiconductor integrated circuit of claim 9, the at least one reference transistor is a reference transmission transistor that becomes conductive in response to the reference module receiving the reference control signal and causes the voltage potential of the reference signal to the amplifier module to be reduced, wherein a channel width of the reference transmission transistor is less than a channel width of the local read transmission transistor.

11. The semiconductor integrated circuit of claim 10, wherein the channel width of the reference control transistor is less than or equal to ⅔ of the channel width of the local read control transistor, and wherein the channel width of the reference transmission transistor is less than or equal to ⅔ of the channel width of the local read transmission transistor.

12. The semiconductor integrated circuit of claim 10, wherein the channel width of the reference control transistor is ½ of the channel width of the local read control transistor, and wherein the channel width of the reference transmission transistor is ½ of the channel width of the local read transmission transistor.

13. The semiconductor integrated circuit of claim 1, wherein the amplifier module is a differential amplifier, wherein a first input end of the differential amplifier is coupled to the second data line and a second input end of the differential amplifier is coupled to the reference data line.

14. The semiconductor integrated circuit of claim 1, further comprising:
a local amplifier module configured to amplify data of the first data line and data of the first complementary data line.

15. The semiconductor integrated circuit of claim 14, wherein the local amplifier module comprises a first phase inverter and a second phase inverter, wherein an input end of the first phase inverter is coupled to the first data line and an output end of the first phase inverter is coupled to the first complementary data line, and wherein an input end of the second phase inverter is coupled to the output end of the first phase inverter and the first complementary data line, and an output end of the second phase inverter is coupled to the input end of the first phase inverter and the first data line.

16. A memory comprising:
a plurality of sense amplifier arrays;
a plurality of memory cell arrays, wherein each of the plurality of memory cells is coupled to at least one of the plurality of sense amplifier arrays to form a memory array; and
a semiconductor integrated circuit, wherein the semiconductor integrated circuit comprises:
a first data line coupled to a bit line through a column selection module, a first complementary data line coupled to a complementary bit line through the column selection module, a second data line, and a reference data line configured to provide a reference signal;
a local read-write conversion module configured to perform, during a memory read-write operation, in response to a read-write control signal, data transmission from at least one of the first data line or the first complementary data line to the second data line;
an amplifier module configured to amplify data of the second data line based on the reference signal of the reference data line, wherein the reference signal serves as a reference for amplifying the data of the second data line; and
a reference module to output the reference signal to the local read-write conversion module in response to receiving a read control signal of the read write control signal,
wherein the reference module is configured to reduce voltage potential of the reference signal during a memory read operation,
wherein the local read-write conversion module is configured to reduce voltage potential of second data line during the memory read operation, wherein a discharge speed of the local read-write conversion module is greater than a discharge speed of the reference module,
wherein first data lines including the first data line and first complementary data lines including the first complementary data line of the semiconductor integrated circuit are coupled to the memory array through a corresponding sense amplifier array to perform a memory read-write operation on the memory cell array.

17. The memory of claim 16, wherein the plurality of sense amplifier arrays includes:
a plurality of first group of sense amplifier arrays disposed in odd columns of memory arrays;
a plurality of second group of sense amplifier arrays in even columns of memory arrays;
a plurality of second data lines including a first group of data lines corresponding to the plurality of first group of sense amplifier arrays and a second group of data lines corresponding to the plurality of second group of sense amplifier arrays, wherein the first group of data lines corresponds to first data lines and first complementary data lines of the semiconductor integrated circuit that are coupled to the plurality of first group of sense amplifier arrays, and the second group of data lines correspond to the first data line and the first complementary data line of the semiconductor integrated circuit that are coupled to the plurality of second group of sense amplifier arrays;

a first reference data line to provide a first reference signal;

a second reference data line to provide a second reference signal; and an amplifier module including a first group of amplifier modules and a second group of amplifiers, wherein the first group of amplifiers modules amplifies data of the plurality of first group of data lines based on the first reference signal, and wherein the second group of amplifier modules amplifies data of the second group of data lines based on the second reference signal.

18. The memory of claim 17, wherein the first group of amplifier modules correspond to the sense amplifier arrays in the odd columns and the second group of amplifier modules correspond to the sense amplifier arrays in the even columns, and wherein the first group of amplifier modules share the same first reference data line and the second group of amplifier modules share the same second reference data line.

19. The memory of claim 17, one half of the plurality of second data lines are on one side of the first reference data line and the second reference data line, and the other half of the plurality of second data lines are on the other side of the first reference data line and the second reference data line.

* * * * *